US008912784B2

(12) United States Patent
Ohshima

(10) Patent No.: US 8,912,784 B2
(45) Date of Patent: Dec. 16, 2014

(54) CONDUCTIVE MEMBER EVALUATOR AND CONDUCTIVE MEMBER EVALUATION METHOD

(75) Inventor: Tadayuki Ohshima, Atsugi (JP)

(73) Assignee: Ricoh Company, Ltd., Tokyo (JP)

( * ) Notice: Subject to any disclaimer, the term of this patent is extended or adjusted under 35 U.S.C. 154(b) by 627 days.

(21) Appl. No.: 13/229,916

(22) Filed: Sep. 12, 2011

(65) Prior Publication Data

US 2012/0062208 A1 Mar. 15, 2012

(30) Foreign Application Priority Data

Sep. 14, 2010 (JP) ................................ 2010-205237

(51) Int. Cl.
*G01R 31/02* (2006.01)
*G03G 15/02* (2006.01)

(52) U.S. Cl.
CPC ............ *G03G 15/02* (2013.01); *G03G 15/0208* (2013.01)
USPC ............................................ 324/72; 399/176

(58) Field of Classification Search
None
See application file for complete search history.

(56) References Cited

U.S. PATENT DOCUMENTS 7,744,515 B2 * 6/2010 Iwamura et al. ................ 492/56

FOREIGN PATENT DOCUMENTS

| | | | |
|---|---|---|---|
| EP | 0338546 A2 | | 10/1989 |
| JP | 1-267667 | | 10/1989 |
| JP | 5-107871 | | 4/1993 |
| JP | 8-146718 | | 6/1996 |
| JP | 9-179385 | | 7/1997 |
| JP | 2007-78837 | | 3/2007 |
| JP | 2007-79380 | | 3/2007 |
| JP | 2008032826 A | * | 2/2008 |
| JP | 2009-300899 | | 12/2009 |
| JP | 2010-72056 | | 4/2010 |
| JP | 2010072056 A | * | 4/2010 |

* cited by examiner

*Primary Examiner* — Melissa Koval
*Assistant Examiner* — Daniel Miller
(74) *Attorney, Agent, or Firm* — Cooper & Dunham LLP

(57) ABSTRACT

A conductive member evaluator includes a first electrode which has contact with an outer circumferential face of a conductive member, a second electrode which is connected to the shaft center of the conductive member, a voltage applier configured to apply evaluation voltage including at least an AD component between the first electrode and the second electrode, a current value measuring device configured to measure a current value flowing between the first electrode and the second electrode when the evaluation voltage is applied, an extreme value obtaining device configured to obtain at least one extreme value of a maximum value and a minimum value in one cycle of the AD component included in the current value from the current value measured by the current value measuring device; and an evaluation device configured to evaluate the conductive member based on the extreme value obtained by the extreme value obtaining device.

12 Claims, 9 Drawing Sheets

CONDUCTIVE MEMBER EVALUATOR AND CONDUCTIVE MEMBER EVALUATION METHOD

PRIORITY CLAIM

The present application is based on and claims priority from Japanese Patent Application No. 2010-205237, filed on Sep. 14, 2010, the disclosure of which is hereby incorporated by reference in its entirety.

BACKGROUND

1. Technical Field

The present invention relates to a conductive member evaluator which evaluates a conductive member charging an electrostatic latent image carrier provided in an electrophotographic image forming apparatus or the like and a conductive member evaluation method.

2. Description of the Related Art

An electrophotographic image forming apparatus such as a copier, a laser beam printer or a facsimile includes a charging member which performs a process of uniformly charging a surface of a photoreceptor as an electrostatic latent image carrier (i.e., image carrier) on which an electrostatic latent image is formed. As this charging member, a conductive member formed in, for example, a roller shape (hereinafter, referred to as a charging roller) is used. A contact charging method which performs the above charging process by bringing the outer circumferential face of the charging roller into contact with the surface of the photoreceptor is conventionally known (for example, Japanese Patent Application Publication No. H01-267667).

However, the above-described contact charging method has the following problems. (1) The substances constituting the charging roller leak from the charging roller, and adhere to the surface of the photoreceptor. (2) Vibration sound is caused by applying AC voltage to the charging roller. (3) The charging performance is deteriorated if toners on the photoreceptor adhere to the charging roller. (4) The permanent deformation of the contact portion between the charging roller and the photoreceptor is caused by stopping the rotation of the photoreceptor for a long period of time.

In order to solve the above problems, a close charging method, which performs a charging process by closely disposing the charging roller to have a predetermined gap (space) to the surface of the photoreceptor, is proposed (for example, Japanese Patent Application Publication No. H05-107871). In such a close charging method, the charging roller faces the photoreceptor such that the closest distance of the gap becomes 50-300 μm, and the voltage in which the DC voltage and the AC voltage are superimposed is applied to the charging roller, for example, so as to perform the charging process to the photoreceptor. Since the charging roller does not have contact with the photoreceptor in this close charging method, the above problems caused in the contact charging method can be solved.

The charging roller for use in the above contact charging method is required to uniformly have contact with the surface of the photoreceptor in order to uniformly charge the photoreceptor. For this reason, the circumference of the cored bar of the charging roller is coated by an elastic vulcanized rubber. On the other hand, the charging roller for use in the close charging method is required to maintain a uniform gap between the charging roller and the photoreceptor in order to uniformly charge the photoreceptor. For this reason, the circumference of the cored bar of the charging roller is coated by a non-elastic thermoplastic resin without having aging deterioration and deformation. As described above, the charging roller for use in the contact charging method is made of a material different from that of the charging roller for use in the close charging method.

It is known that the discharge in accordance with Paschen's Law in the minute discharge between the charging roller and the photoreceptor significantly contributes to the charging mechanism to the surface of the photoreceptor by the above-described charging roller, regardless of the contact charging method or the close charging method. Therefore, it is important to evaluate the electric property (discharge feature) of the charging roller in order to evaluate the basic performance of the charging roller which uniformly charges the surface of the photoreceptor at predetermined potential.

As a method of evaluating an electric property of a charging roller (i.e., a conductive member evaluation method), the following charging roller evaluation method is used. In this charging roller evaluation method, as schematically illustrated in FIG. 14, a plurality of bar-like electrodes 302 is connected to an outer circumferential face 101*a* of a charging roller 101 in a resting state in the axial direction, an electrode 303 is connected to a cored bar 106 of the charging roller 101, DC voltage is applied between the electrodes 302, 303 by a DC power source, a resistance value of the charging roller 101 is calculated by measuring the current value flowing in the charging roller 101, and the charging roller 101 is evaluated by using this resistance value. According to this evaluation method, a charging roller having a lower resistance value is evaluated as a charging roller which has a high conductive performance, enables even discharge and can obtain a preferable image.

As another conductive member evaluation method, Japanese Patent Application Publication No. 2009-300899 and Japanese Patent Application Publication No. 2010-72056 describe the following method. In this conductive member evaluation method, the above-described charging process is performed while rotating in opposite directions a charging roller and a photoreceptor having a length substantially the same as the length of the charging roller, which are disposed in parallel with a contact state or a close state, similar to an actual image forming apparatus, the current waveform flowing in the charging roller and the photoreceptor is measured, and the charging roller is evaluated based on the area of the measured current waveform and the phase difference between the applied voltage waveform and the measured current waveform.

Various configurations, manufacturing methods or the like have been developed for the above-described charging rollers. However, an image formed by these charging rollers may include local uneven concentration depending on the configuration, the manufacturing method or the manufacturing condition of the charging roller. FIG. 15 illustrates one example of an image including local uneven concentration. The right and left direction in FIG. 15 conforms to the axial direction of the charging roller and the up and down direction conforms to the circumferential direction of the charging roller. In this description, "local" means a part of the axial direction in the outer circumferential face of the charging roller or a part of the direction corresponding to the axial direction and a part of the circumferential direction or a part of the direction corresponding to the circumferential direction.

The following is considered as a reason for such local uneven concentration. For example, when forming an electric resistance adjusting layer on a cored bar as a shaft center in manufacturing a charging roller, an adhesion property between the cored bar and the electric resistance adjusting layer is locally deteriorated due to an extrusion molding method, an injection molding method or a condition of the molding, so that the electric property such as a resistance value in this portion changes relative to another portion; thus, the conductive performance becomes uneven. Namely, a local difference of an electric property occurs in the outer circumferential face of the charging roller, so that local uneven concentration occurs in an image by this difference.

However, in the conventional evaluation method using the device illustrated in FIG. 14, since a plurality of bar-like electrodes 302 is connected to the outer circumferential face 101*a* of the charging roller 101 in the axial direction, the resistance values are measured in a plurality of portions of the outer circumferential face 101*a* in the axial direction. Consequently, the resistance value can not be measured in a part of the axial direction. Since the charging roller 101 is measured in a resting state, a plurality of electrodes 302 is moved in the circumferential direction every measurement, so that the charging roller 101 can not be continuously measured in the circumferential direction. Namely, an electric property can not be measured in a local part of the outer circumferential face of the charging roller. For this reason, a local difference of the electric property in the outer circumferential face of the charging roller can not be detected, and the local uneven concentration of the image can not be evaluated.

Moreover, in the another conventional evaluation method using an area of a current waveform and a phase difference between a voltage waveform and a current waveform, since the entire charging roller in the axial direction discharges to the photoreceptor, the discharge can not be performed to a local portion of the outer circumferential face. For this reason, similar to the above evaluation method, the local uneven concentration of the image can not be evaluated.

SUMMARY

The invention has been made in view of the above circumferences, and an object of the invention is provide a conductive member evaluator and a conductive member evaluation method which can evaluate a conductive member by detecting a local difference of an electric property of an outer circumferential face of a conductive member.

In order to achieve the above object, one embodiment of the present invention provides a conductive member evaluator, comprising: a cylindrical or spherical first electrode which has contact with an outer circumferential face of a roller-like conductive member rotating about a shaft center, and configured to rotate in a direction opposite the conductive member; a second electrode which is connected to the shaft center of the conductive member; a voltage applier configured to apply evaluation voltage including at least an AC component between the first electrode and the second electrode; a current value measuring device configured to measure a current value flowing between the first electrode and the second electrode when the evaluation voltage is applied by the voltage applier; an extreme value obtaining device configured to obtain at least one extreme value of a maximum value and a minimum value in one cycle of the AC component included in the current value from the current value measured by the current value measuring device; and an evaluation device configured to evaluate the conductive member based on the extreme value obtained by the extreme value obtaining device.

One embodiment of the present invention also provides a conductive member evaluation method, comprising: a voltage applying step of applying evaluation voltage including at least an AC component between a cylindrical or spherical first electrode which has contact with an outer circumferential face of a roller-like conductive member rotating about a shaft center, and configured to rotate in a direction opposite the conductive member and a second electrode which is connected to the shaft center of the conductive member; a current value measuring step of measuring a current value flowing between the first electrode and the second electrode when the evaluation voltage is applied by the voltage applying step; an extreme value obtaining step of obtaining at least one extreme value of a maximum value and a minimum value in one cycle of the AC component included in the current value from the current value measured by the current value measuring step; and an evaluation step of evaluating the conductive member based on the extreme value obtained by the extreme value obtaining step.

BRIEF DESCRIPTION OF THE DRAWINGS

The accompanying drawings are included to provide further understanding of the invention, and are incorporated in and constitute a part of this specification. The drawings illustrate an embodiment of the invention and, together with the specification, serve to explain the principle of the invention.

DETAILED DESCRIPTION OF THE PREFERRED EMBODIMENT

Figure 1:
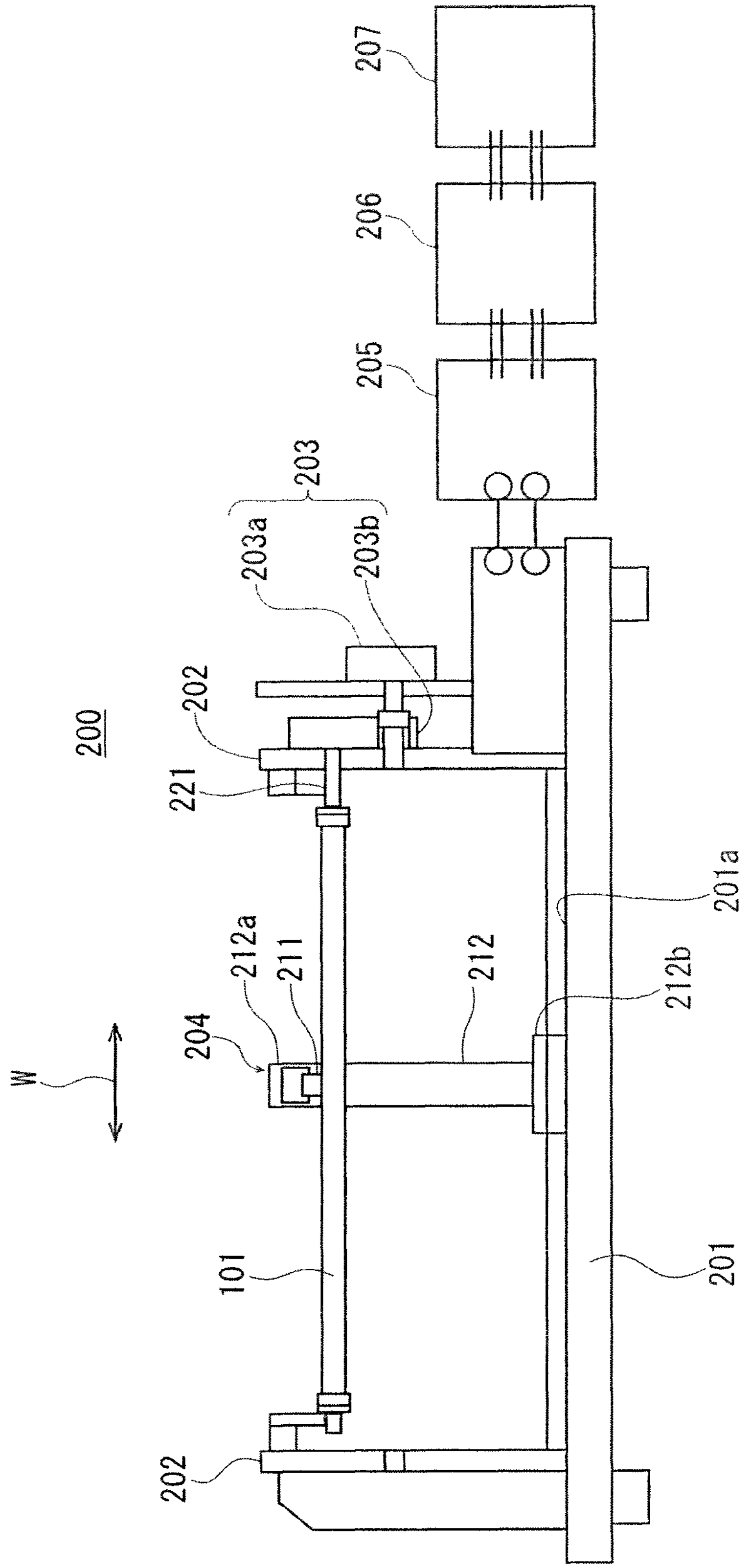
FIG. 1 is a configuration view illustrating a conductive member evaluator according to one embodiment of the present invention.

Hereinafter, one embodiment of a conductive member evaluator and an evaluation method, configuration examples of a conductive member which is evaluated in the conductive member evaluator, and an image forming apparatus including the conductive member will be described. After describing the configuration examples, evaluation results by the present inventors will be described.

(Conductive Member Evaluator and Evaluation Method)

At first, how the present invention has been achieved will be described with reference to FIGS. 5-7.

After studying an evaluation method of a conductive member in order to detect a local difference of an electric property in an outer circumferential face of a roller-like conductive member, the present inventors brought one electrode into contact with a local part (a part of the axial direction and a part of the circumferential direction) of the outer circumferential face of the conductive member, and measured a current value flowing between the electrode and another electrode connected to the shaft center of the conductive member when applying voltage including an AC component while moving the electrode in the circumferential direction of the outer circumferential face, and found that the extreme value of the current value in one rotation cycle was changed according to the local difference of the electric property of the outer circumferential face.

In order to detect a local difference of an electric property of an outer circumferential face of a charging roller as a conductive member, the present inventors focused on the extreme value in one cycle of an AC component of a current value which flows when applying evaluation voltage including the AC component between a local part of the outer circumferential face and the cored bar (i.e., shaft center) of the charging roller. Then, the present inventors prepared (A) an undesirable charging roller (hereinafter, referred to as a charging roller A) which causes local uneven concentration on an image and (B) a desirable charging roller (hereinafter, referred to as a charging roller B) which does not cause local uneven concentration on an image, and confirmed the waveform of the above extreme value as described below for each of the charging rollers.

The present inventors connected a rotatably supported cylindrical first electrode to a local part of the outer circumferential face of the charging roller A and connected a second electrode to the cored bar of the charging roller A, rotated the charging roller A in one direction, and rotated the first electrode in the direction opposite the one direction at the same linear speed (namely, the circumferential direction movement speed of the surface), relatively moved the first electrode in the circumferential direction of the outer circumferential face of the charging roller, applied evaluation voltage between the first electrode and the second electrode in which sine wave AC voltage is superimposed to the DC voltage, and measured the current value (evaluation current) flowing therein. FIG. 5 illustrates the waveform of the measured evaluation current.

Figure 5A:
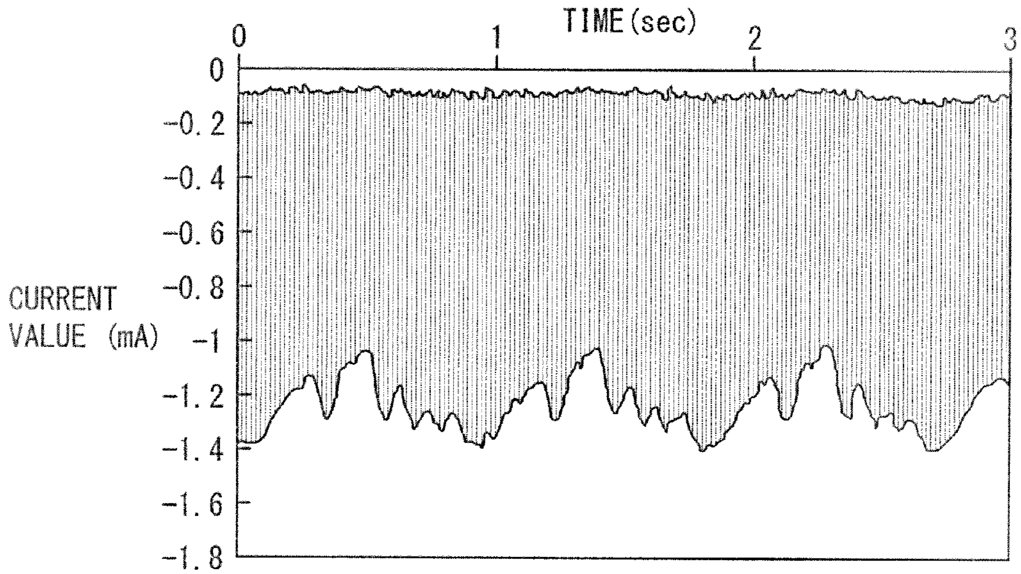
FIG. 5A is a graph illustrating one example of a waveform of evaluation current measured for an undesirable charging roller which causes local uneven concentration on an image.
Figure 5B:
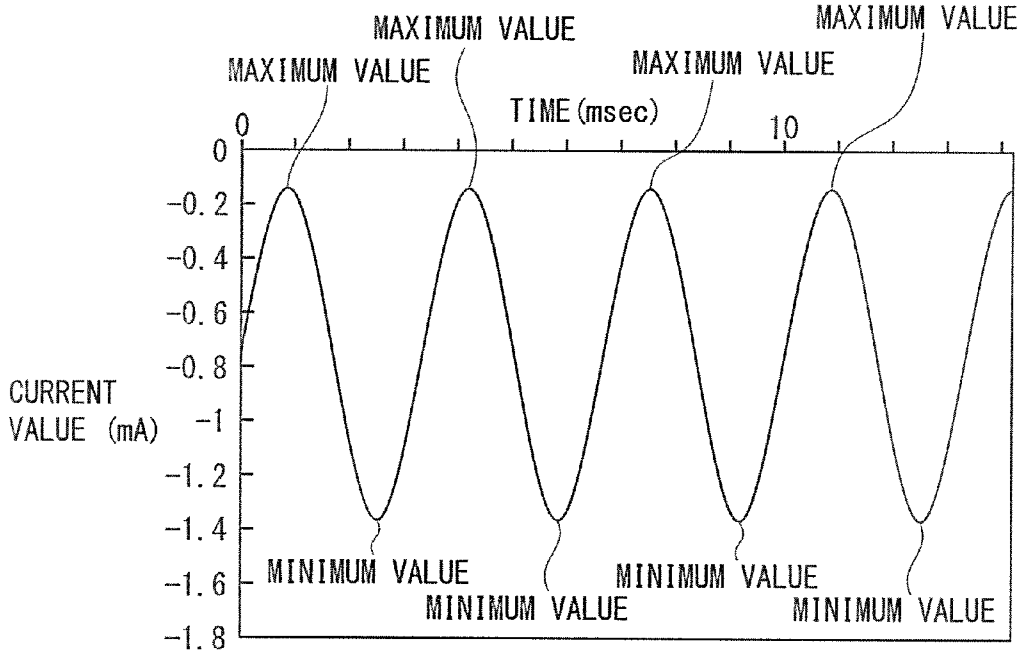
FIG. 5B is a graph enlarged a part of the graph in FIG. 5A.

The waveform illustrated in FIG. 5A is illustrated in a planar state because the time scale is large, but the waveform is actually an AC waveform as illustrated in the enlarged view of FIG. 5B. As illustrated in FIG. 5A, the maximum value in the AC component of the evaluation current substantially becomes constant near −0.1 V, and the minimum value fluctuates near −1.0 V to −1.4 V. If the evaluation voltage includes a negative DC component, the minimum value of the DC component significantly fluctuates as illustrated in FIG. 5A. On the other hand, if the evaluation voltage includes a positive AC component, the maximum value of the AC component significantly fluctuates. The portion in which the difference (i.e., amplitude) between the maximum value and the minimum value in one cycle of the AC component is large indicates that the resistance value (including reactance) between a part of the outer circumferential face of the charging roller and the cored bar is small, and the portion in which the difference is small indicates that the resistance value is large. The evaluation current of the waveform is measured while relatively moving the first electrode in the circumferential direction of the outer circumferential face of the charging roller, so that this waveform changes according to the electric property such as the resistance value of the contact portion of the first electrode in the outer circumferential face, namely, this change indicates a local difference of the electric property of the circumferential direction in the outer circumferential face of the charging roller. In FIG. 5, since the maximum value is substantially constant, the minimum value is only referred, and the minimum value is obtained from the evaluation current. FIG. 6 illustrates the waveform of the obtained minimum value.

Figure 6:
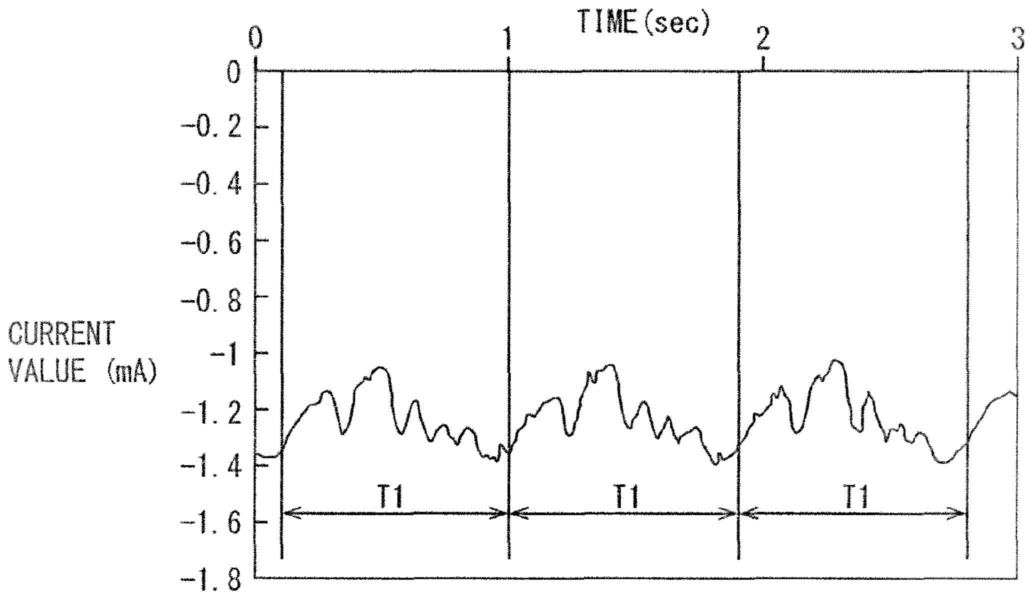
FIG. 6 is a graph illustrating one example of change (waveform) of a minimum value in one cycle of an AC component in the evaluation current illustrated in FIG. 5A.
Figure 7:
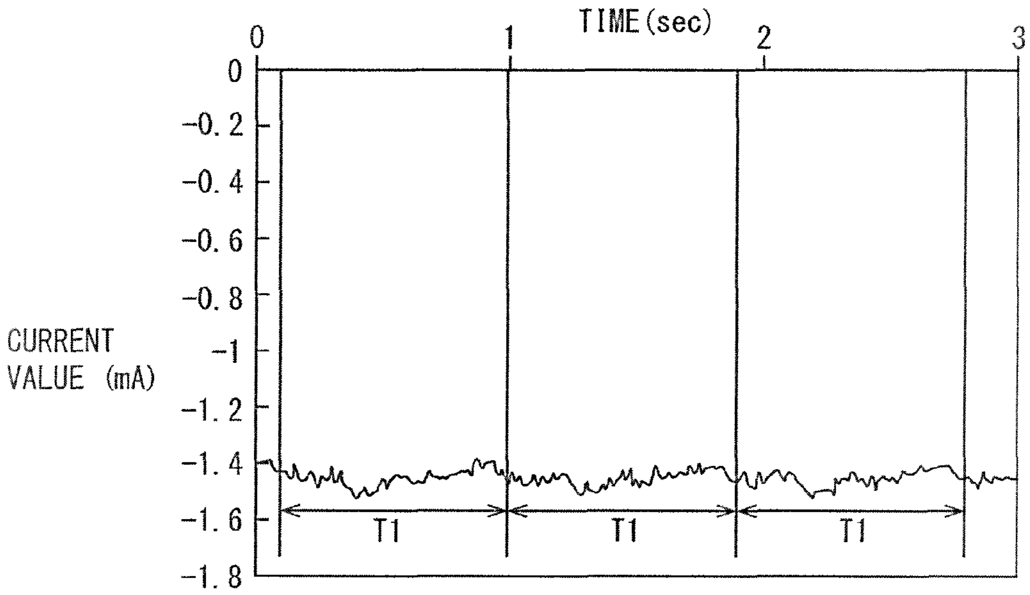
FIG. 7 is a graph illustrating one example of change (waveform) of a minimum value in one cycle of an AC component in the evaluation current measured for a desirable charging roller which does not cause local uneven concentration on an image.

As illustrated in FIG. 6, the minimum value repeats a similar waveform each rotation cycle T1 of the charging roller A. Comparing the change in this waveform and the image formed by using the charging roller A, it became clear that the change in this waveform conformed to the local uneven concentration on an image.

Similar to the above, the present inventors measured the evaluation current for the charging roller B, and obtained the minimum value from the evaluation current. FIG. 7 illustrates the waveform of the obtained minimum value. As illustrated in FIG. 7, the minimum value repeats a similar waveform every rotation cycle T1 of the charging roller B similar to the above, and the fluctuation of this waveform is very small compared to the waveform in FIG. 6, which is a substantially constant value. It became also clear that the waveform conformed to an image state without having local uneven concentration formed by using the charging roller B.

From these results, it becomes apparent that the waveform of the extreme value of the evaluation current corresponds to the local difference of the electric property of the outer circumferential face of the charging roller, and relates to the local uneven concentration of an image. More specifically, the present inventors found that the local uneven concentration formed by using the charging roller could be evaluated based on this extreme value, and realized the present invention.

Figure 2A:
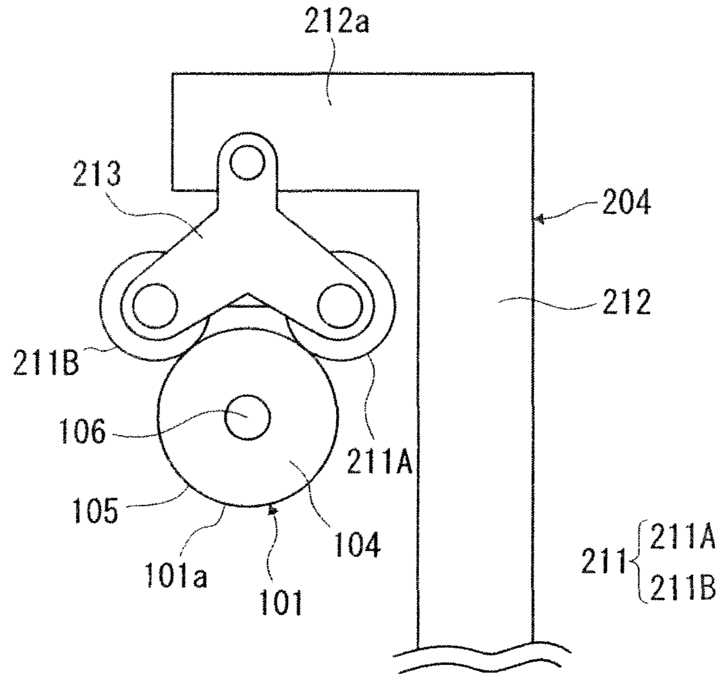
FIG. 2A is a side view illustrating an electrode supporter (constituting a first electrode by two cylindrical members) provided in the conductive member evaluator in FIG. 1.
Figure 2B:
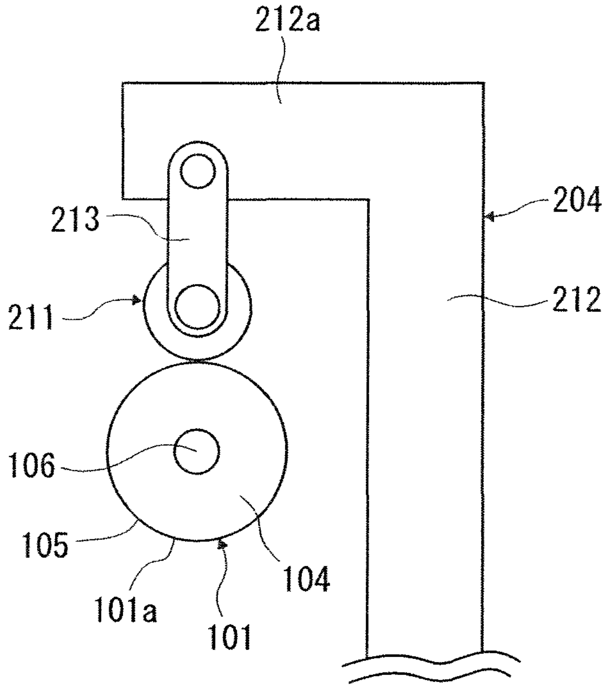
FIG. 2B is a side view illustrating a configuration (constituting a first electrode by one cylindrical member) of a modified example of the electrode supporter in FIG. 2A.
Figure 3:
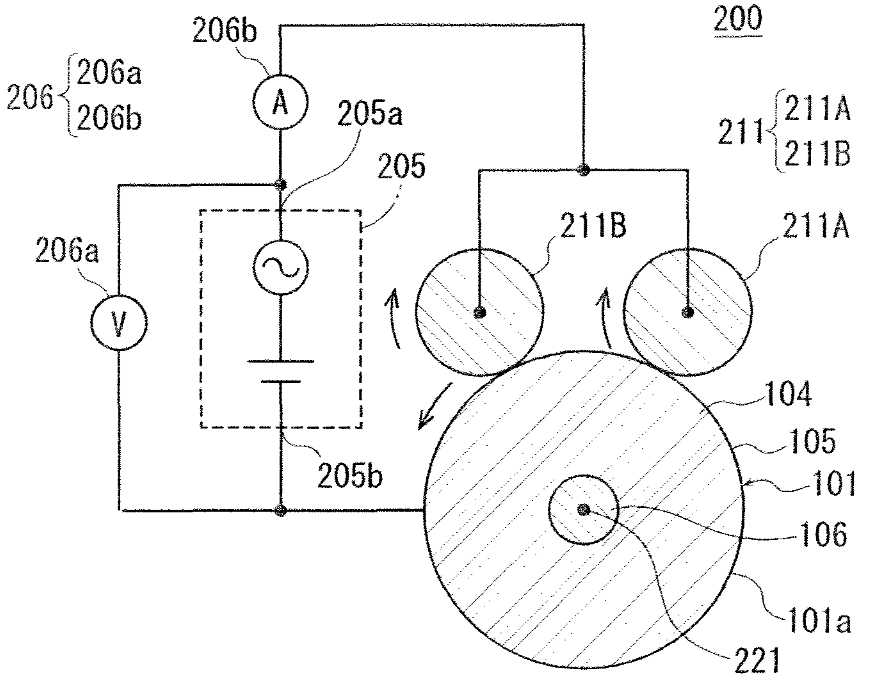
FIG. 3 is a view schematically illustrating an electric connection of the conductive member evaluator in FIG. 1.
Figure 4:
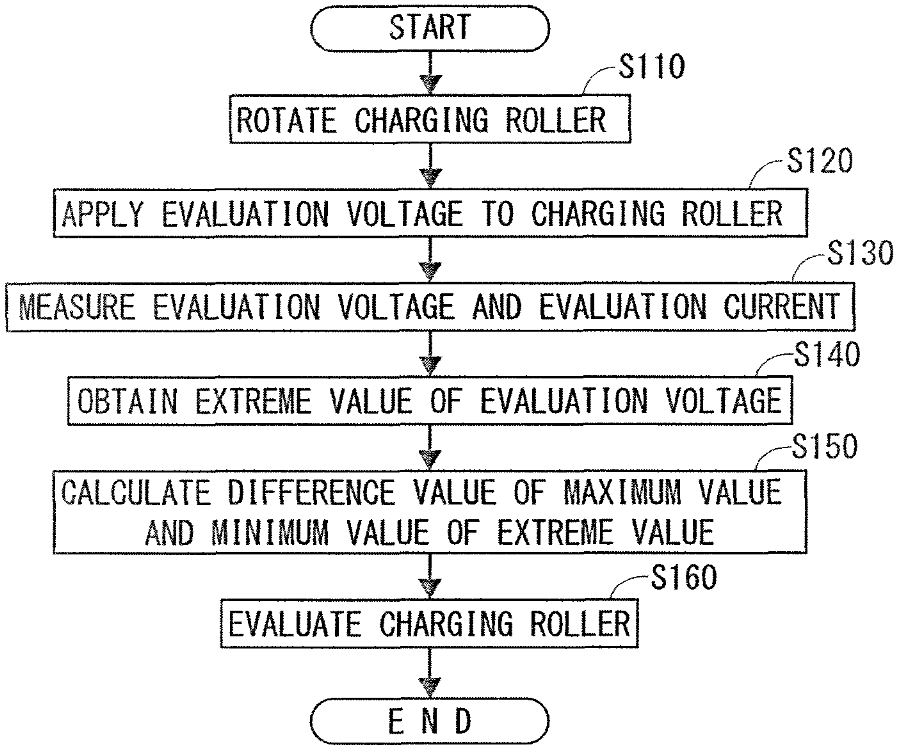
FIG. 4 is a flow chart illustrating one example of an evaluation process which is performed by a controller provided in the conductive member evaluator in FIG. 1.

Hereinafter, a conductive member evaluator according to one embodiment of the present invention will be described with reference to FIGS. 1-4. FIG. 1 is a configuration view illustrating the conductive member evaluator. FIG. 2A is a side view illustrating an electrode supporter (constituting the first electrode by two cylindrical members). FIG. 2B is a side view illustrating a configuration (constituting the first electrode by one cylindrical member) of the modified example of the electrode supporter. FIG. 3 is a view schematically illustrating an electric connection of the conductive member evaluator in FIG. 1. FIG. 4 is a flow chart illustrating one example of an evaluation process which is performed by a controller provided in the conductive member evaluator in FIG. 1.

A conductive member evaluator 200 is used to evaluate a charging roller as a conductive member. The conductive member evaluator 200 is specifically used to previously evaluate whether or not local uneven concentration occurs on an image formed by a charging roller when a configuration and a manufacturing method of a charging roller are newly developed. The use of the conductive member evaluator is not obviously limited thereto, and it can be used for the evaluation in the production line of the charging roller.

A charging roller 101 which is evaluated by the conductive member evaluator 200 includes a conductive supporting body 106 as a cored bar (i.e., shaft center), a cylindrical electric resistance adjusting layer 104 provided on the conductive supporting body 106, and a surface layer 105 provided on the outer circumferential face of the electric resistance adjusting layer 104. The conductive supporting body 106 and the electric resistance adjusting layer 104 are fixed to each other, and the charging roller 101 rotates about the conductive supporting body 106. The details of the charging roller 101 will be described later.

The conductive member evaluator 200 includes a base 201, a pair of supporters 202, a driver 203, an electrode supporter 204 in which a first electrode 211 is provided, a second electrode 221, a power source 205, a measuring portion 206 and a controller 207 as illustrated in FIG. 1.

The base 201 is formed in a planar shape, and is disposed on a floor, a table or the like in a plant. The base 201 includes an upper surface 201*a* retained in parallel in the horizontal direction. The planar shape of the base 201 is formed in a rectangular shape.

A pair of supporters 202 is a planar or a bar-like member provided vertically to face each other from the upper face 201*a* of the base 201. A pair of supporters 202 rotatably supports the charging roller 101 therebetween. The charging roller 101 can be easily attached and detached to and from a pair of supporters 202. Since high voltage is applied to the charging roller 101, the potions in the base 201 and a pair of supporters 202, which are located near the charging roller 101, are made by a material having an electric insulation performance.

The driver 203 is disposed in one of the supporters 202, and includes a known motor 203*a* and a driving force transmission portion 203*b* having a plurality of gears engaged to each other. The driver 203 transmits the rotation of the motor 203*a* via a plurality of gears of the driving force transmission portion 203*b*, and rotates the charging roller 101 in one direction. The driver 203 is connected to the after-described controller 207, and the rotation speed or the like of the charging roller 101 is controlled based on the control signal from the controller 207.

The electrode supporter 204 includes the first electrode 211 and a supporting portion 212. The first electrode 211 includes two adjacent cylindrical electrodes 211A, 211B as illustrated in FIG. 2A made of, for example, conductive metal such as copper. In this embodiment, each of the electrodes 211A, 211B is formed at about 10 mm in outer diameter and about 4 mm in thickness (length in axial direction). The first electrode 211 can be formed as one cylindrical electrode as illustrated in FIG. 2B, but it is preferable for the first electrode 211 to be made of a plurality of adjacent electrodes because the influence on the measurement value of the condition of the outer circumferential face 101*a* of the surface layer 105 of the charging roller 101 (hereinafter, referred to as the outer circumferential face 101*a* of the charging roller 101) can be reduced. Moreover, the first electrode 211 is formed in a cylindrical shape or a spherical shape and has a length in the rotation axial direction shorter than the length of the outer circumferential face 101*a* of the charging roller 101 in the axial direction except in the case of a spherical first electrode, so as to have contact with a part of the outer circumferential face 101*a* of the charging roller 101 in the axial direction and a part of the outer circumferential face 101*a* of the charging roller 101 in the circumferential direction (i.e., a local part of the circumferential surface 101*a*). The first electric pole 211 can be formed in a spherical shape having a length in the rotation axial direction shorter than the length of the outer circumferential face 101*a* of the charging roller 101 in the axial direction.

The supporting portion 212 is formed in a substantial L-shape in which one end portion 212*a* is bent at a right angle. The supporting portion 212 is provided on the upper surface 201*a* of the base 201 such that one end portion 212*a* is disposed above the charging roller 101 at a space. One end portion 212*a* of the supporting portion 212 includes a shaft bearing 213, and rotatably supports the first electrode 211. The first electrode 211 is connected to one terminal 205*a* of the after-described power source 205 via the shaft bearing 213. The other end portion 212*b* of the supporting portion 212 is attached to the upper surface 201*a* of the base 201 to be movable in the relative direction of a pair of supporters 202 (arrow W in FIG. 1), namely, the axial direction of the charging roller 101. The supporting portion 212 is attached to a not shown actuator for moving the first electrode connected to the after-described controller 207, and is moved by this actuator, so that the position of the charging roller 101 in the axial direction is controlled. In addition, the supporting portion 212 can be manually moved.

The first electrode 211 is disposed such that its rotation axis becomes parallel to the rotation axis of the charging roller 101 (i.e., the conductive supporting body 106) supported by a pair of supporters 202, and the outer circumferential face of the first electrode 211 (i.e., the electrodes 211A, 211B) has contact with a local part of the outer circumferential face 101*a* of the charging roller 101 (i.e., a part including the two contact portions with the electrodes 211A, 211B). Accordingly, the first electrode 211 rotates in the direction opposite the rotation direction of the charging roller 101 at the substantially same linear speed as the rotation of the charging roller 101. More specifically, the first electrode 211 has contact with the outer circumferential face 101*a* of the charging roller 101 to relatively move in the circumferential direction.

In the present embodiment, the first electrode 211 is rotatably supported, and is provided to rotate with the rotation of the charging roller 101. However, a rotation driver such as a motor is provided in the electrode supporter 204, and the first electrode 211 rotates in the opposite direction at a linear speed which is the same as that of the charging roller 101.

The second electrode 211 is made of, for example, a known slip ring, brush electrode or metal piece to be electrically connected to the rotating conductive supporting body 106. The second electrode 211 is disposed in one of the supporters 202. The second electrode 221 is provided to be electrically connected to the conductive supporting body 106 (i.e., shaft center) in the charging roller 101 rotatably supported by one of the supporters 202.

As illustrated in FIG. 3, the power source 205 includes a DC voltage source and a sine wave AC voltage source, and is configured to generate voltage of an arbitrary frequency (i.e., evaluation voltage) between a pair of terminals 205*a*, 205*b*. The power source 205 generates the evaluation voltage by superimposing the AC voltage (AC component) which becomes a sine wave to the DC voltage (DC component). This evaluation voltage includes at least an AC component. It is more preferable for the evaluation voltage to include the DC component together with the AC component. Since the frequency f (Hz) of this AC voltage is required to correspond to an actual machine, the frequency f (Hz) is set such that the frequency linear speed ratio f/V becomes 7 or above and 12 or below relative to the linear speed V (mm/sec) of the charging roller 101. If the frequency linear speed ratio is within this range, the measurement can be performed by lowering the linear speed. The power source 205 is connected to the after-described controller 207 and the voltage and the frequency generating between the terminals 205*a*, 205*a* are controlled based on the control signals from the controller 207.

One terminal 205*a* of the power source 205 is connected to the first electrode 211 provided in the electrode supporter 204 via an ammeter 206*b* provided in the measuring portion 206. The other terminal 205*b* of the power source 205 is connected to the second electrode 221.

The measuring portion 206 is a known measuring instrument having a voltmeter 206*a* and the ammeter 206*b*. The voltmeter 206*a* is connected between the terminals 205*a*, 205*b* of the power source 205, and measures the voltage (evaluation voltage) generated by the power source 205. The ammeter 206*b* is connected between one terminal 205*a* of the power source 205 and the first electrode 211, and measures the current value (evaluation current) flowing between the first electrode 211 and the second electrode 221, i.e., between a local part of the outer circumferential face 101*a* of the charging roller 101 and the conductive supporting body 106. The measuring portion 206 is connected to the controller 207, and sends the measurement information regarding the evaluation voltage and the evaluation current to the controller 207. In the measuring portion 206, it is necessary for the sampling rate when measuring the evaluation voltage and the evaluation current to be higher than the frequency of the AC voltage, and the sampling rate which can obtain the extreme value (maximum value and/or minimum value) in one cycle of the AC component in the evaluation voltage is specifically required.

The controller 207 is constituted by a known computer such as a personal computer (PC). The controller 207 is connected to the driver 203, the power source 205, the measuring portion 206 and the actuator for moving the first electrode via the various external interfaces such as a USB or a GPIB in the controller, and sends and receives control signals and various information therebetween.

The controller 207 includes a memory such as a hard disk or a memory card. The following information is previously stored in this memory, for example, (1) information regarding the rotation speed (linear speed) of the charging roller 101, (2) information regarding the evaluation voltage (DC voltage value, AC voltage value and AC frequency) which is applied to the charging roller 101 and (3) a standard difference value Dt for use in the determination of the difference value D between the minimum value and the maximum value of the extreme value in one rotation period of the charging roller 101. This standard difference value Dt is appropriately defined in accordance with the frequency and the voltage value of the evaluation voltage and the constitution of the charging roller 101 of the evaluation target, for example.

The controller 207 conducts various controls in the conductive member evaluator 200 based on the programs previously stored in a ROM, a memory or the like, calculates the difference value D between the minimum value and the maximum value of the extreme value of the evaluation current in a predetermined evaluation period such as one rotation period of the charging roller 101 based on the measurement information regarding the evaluation current received from the measuring portion 206, and evaluates the charging roller 101 based on the result in which the difference value D is compared to the previously defined standard different value Dt.

The evaluation process which is performed by the controller 207 will be described with reference to the flow chart in FIG. 4.

At first, the charging roller 101 as an evaluation target is attached to a pair of supporters 202, the first electrode 211 is brought into contact with a local part of the outer circumferential face 101*a* of the charging roller 101, the second electrode 221 is connected to the conductive supporting body 106 of the charging roller 101, and the power source of the conductive member evaluator 200 is turned on. Upon the turning on of the power source, the evaluation process is started after performing a predetermined initialization process.

The controller 207 reads the information regarding the rotation speed (linear speed) of the charging roller 101 from the memory, sends a predetermined control signal to the driver 203 based on this information, and rotates the charging roller 101 in one direction at a predetermined linear speed (for example, 40 mm/sec) (Step 110). The first electrode 211 which has contact with the outer circumferential face 101*a* of the charging roller 101 thereby rotates in the opposite direction at the substantially same linear speed.

Then, the controller 207 reads the information regarding the evaluation voltage which is applied to the charging roller 101 from the memory, sends a predetermined control signal to the power source 205 based on this information, and applies the predetermined evaluation voltage between the first electrode 211 and the second electrode 221, i.e., between a local part of the outer circumferential face 101*a* of the charging roller 101 and the conductive supporting body 106 (S120). This evaluation voltage is, for example, a voltage in which the AC voltage (voltage between peaks Vpp=1.0 kV, frequency f=300 Hz) is superimposed to the DC voltage (Vdc=−0.7 kV). The frequency linear speed ratio f/V therein is 7.5.

The controller 207 starts the measurement of the evaluation voltage and the evaluation current by the measuring portion 206. Then, the measuring portion 206 sequentially measures the evaluation voltage, and sequentially measures the evaluation current flowing between the first electrode 211 and the second electrode 221 in a state in which the contact portion of the first electrode 211 moves in the circumferential direction of the charging roller 101 with the rotation of the charging roller 101. The controller 207 sequentially receives the measurement information regarding the evaluation voltage and the evaluation current from the measuring portion 206 (S130).

The controller 207 analyzes the measurement information received from the measuring portion 206, and obtains the extreme value in one cycle of the AC component in the evaluation current (S140). Specifically, if a negative DC component is included in the evaluation value, the controller obtains the minimum value, and if a positive DC component is included in the evaluation voltage, the controller obtains the maximum value, and if the DC component is not included, the controller obtains either the minimum value or the maximum value.

Then, the controller 207 calculates the difference value D between the maximum value and the minimum value in one rotation period of the charging roller 101 (Step 150).

After calculating the above difference value D several times (for example, two times), the controller 207 compares a plurality of calculated difference values D to the standard difference value Dt (for example 0.3 mA) stored in the memory. If all of the difference values D are the standard difference value Dt or below, it is determined that a local difference of the electric property in the outer circumferential face of the electric resistance adjusting layer 104 of the charging roller 101 is small, so that the charging roller 101 is evaluated as a charging roller which can obtain a preferable image without having local uneven concentration. If even one of the difference values D is larger than the standard difference value Dt, it is determined that a local difference of the electric property is large, so that the charging roller 101 is evaluated as a charging roller which forms a defective image having local uneven concentration. These evaluation results are displayed on a display device such as a display provided in the controller 207 (S160). Then, the process of the flow chart in FIG. 4 is completed.

In the above evaluation process, a part of the outer circumferential face 101*a* of the charging roller 101 in the axial direction is only evaluated over the entire portion in the circumferential direction. However, if needed, by moving the electrode supporter 204 in the axial direction of the charging roller 101, the first electrode 211 is brought into contact with another part of the outer circumferential face 101*a* of the charging roller 101 in the axial direction, and the above evaluation process is again performed for another part, and a plurality of parts in the axial direction can be evaluated. In order to further effectively evaluate the charging roller 101, it is preferable to perform the above evaluation process over the entire portion of the outer circumferential face 101*a* of the charging roller 101 in the axial direction. Moreover, a plurality of difference values D is calculated, and these are compared to the standard difference value Dt, but only one difference value D can be compared with the standard difference value Dt. However, it is preferable to use a plurality of difference values D for improving the accuracy.

The above Step 120 is a voltage applier and a voltage applying step, Step 130 is a current value measuring device and a current value measuring step, Step 140 is an extreme value obtaining device and an extreme value obtaining step in the claims, and Steps 150, 160 is an evaluation device and an evaluation step.

The charging roller 101 was actually evaluated by using the above-described conductive member evaluator 200. A plurality of charging rollers 101 of 12.7 mm in diameter and 315 mm in total length was prepared and these charging rollers 101 were attached to the conductive member evaluator 200. Then, the charging rollers 101 were rotated at a linear speed of 40 mm/sec in the atmosphere of 50% RH and the measurement environment of 23° C. Then, the DC voltage Vdc=−0.7 kV, the voltage between peaks Vpp=1.0 kV and the frequency f=voltage of 300 Hz were applied between the first electrode 211 and the second electrode 221, and the difference value D of the maximum value and the minimum value of the extreme value of the evaluation current flowing between the first electrode 211 and the second electrode 221 in one rotation period of the charging roller 101 was obtained. Then, the charging roller (hereinafter, referred to as the charging roller A) in which the difference value D is 0.3 mA or below in the entire portion of the outer circumferential face 101*a* of the charging roller 101 and the charging roller (hereinafter, referred to as the charging roller B) in which the difference value D is larger than 0.3 mA were selected. Solid images of predetermined concentration were formed by using the selected charging rollers. As a result, a desirable image without having local uneven concentration was obtained by the charging roller A and an undesirable image with local uneven concentration was obtained by the charging roller B. Namely, the evaluation results of the conductive member evaluator 200 conform to the image evaluation results regarding the local uneven concentration of the formed images.

According to the present embodiment, the cylindrical first electrode 211 has contact with a local part of the outer circumferential face 101*a* of the charging roller 101 rotating about the conductive supporting body 106, and rotates at the linear speed which is the same as that of the charging roller 101 in the opposite direction, and is connected to the outer circumferential face 101*a* of the charging roller 101, the second electrode 211 is connected to the conductive supporting body 106 of the charging roller 101, the evaluation voltage including the AC component is applied between the electrodes, and the current value flowing between the conductive supporting body 106 and the contact portion of the outer circumferential face 101*a* of the charging roller 101 which moves in the circumferential direction with the rotation is measured. Then, the extreme value (maximum value and/or minimum value) in one cycle of the AC component is obtained from the measured current value, and the charging roller 101 is evaluated based on this extreme value.

The difference value D between the maximum value and the minimum value of the extreme value in one rotation period of the charging roller 101 is calculated, and the charging roller 101 is evaluated based on the comparison result of the difference value D and the previously obtained standard difference value Dt.

As described above, in the present embodiment, since the current value flowing between the conductive supporting body 106 and the contact portion of the first electrode 211 in the outer circumferential face 101*a* of the charging roller 101, which moves in the circumferential direction with the rotation, is measured, the extreme value (maximum value and/or minimum value) in one cycle of the AC component in the current value indicates an electric property of the contact portion of the first electrode 211 in the outer circumferential face 101*a* of the charging roller 101, namely, an electric property of a local part of the outer circumferential face 101*a* of the charging roller 101. Accordingly, by using the extreme value obtained from the current value continuously measured in a local part of the outer circumferential face 101*a* while moving in the circumferential direction, a local difference of an electric property in the outer circumferential face 101*a* of the charging roller 101 can be detected, and the charging roller 101 can be evaluated for local concentration unevenness.

Moreover, since the charging roller 101 is evaluated based on the comparison result between the difference value D of the maximum value and the minimum value of the extreme value in the one rotation cycle of the charging roller 101 and the previously defined standard difference value Dt, the maximum and the minimum values of the extreme value correspond to a high concentration portion and a low concentration portion, respectively. Accordingly, the charging roller 101 can be evaluated by the concentration difference in the local uneven concentration. Furthermore, the charging roller 101 can be evaluated by a simple process without using a complex calculation, and the charging roller 101 can be evaluated by detecting the local difference of the electric property over the entire portion of the charging roller 101 in the circumferential direction.

In the present embodiment, one of the minimum value and the maximum value of the evaluation current is used for the evaluation of the charging roller 101, but it is not limited thereto. For example, both of the minimum value and the maximum value can be used, and it can be determined whether or not one of the difference value D is larger than the standard difference value Dt for the evaluation. Moreover, the amplitude in one cycle of the AC component (i.e., difference of the maximum value and the minimum value) is obtained by using both of the minimum value and the maximum value, and the evaluation can be performed by using this amplitude similar to the extreme value. More specifically, the difference value of the maximum value and the minimum value of the amplitude in one rotation period of the charging roller 101 is calculated, and this difference value is compared with the previously defined standard difference value of the amplitude, and the charging roller 101 is evaluated based on this comparison result.

In the present embodiment, the difference value D of the maximum value and the minimum value of the extreme value of the evaluation current is compared to the previously defined standard difference value Dt, so as to evaluate the charging roller 101, but it is not limited thereto. For example, the standard deviation σ of the extreme value of the evaluation current is calculated, and this standard deviation σ is compared to the previously defined standard deviation value, so as to evaluate the charging roller 101 based on this comparison result. Accordingly, the charging roller 101 can be evaluated according to the variation of the extreme value, i.e., the variation of the local concentration of the image.

The variation of the minimum value of the evaluation current per unit time can be calculated, and the charging roller 101 can be evaluated based on the comparison result of the variation and the previously defined standard variation value. The variation of the minimum value per unit time indicates the inclination of the local change of the electric property in the outer circumferential face 101*a* of the charging roller 101. If this inclination is large, the concentration change is significant, and if the inclination is small, the concentration change is gradual. Accordingly, by evaluating the charging roller 101 with the variation, the charging roller 101 can be evaluated based on the concentration change in the uneven concentration of the image.

In the present embodiment, the evaluation is performed by using one rotation time of the charging roller 101 as a predetermined evaluation period, but it is not limited thereto. For example, the evaluation can be performed by using the extreme values in a plurality of rotation periods of the charging roller 101. The length of the evaluation period can be arbitrarily determined as long as it does not depart from the object of the present invention.

(Conductive Member)

Figure 8:
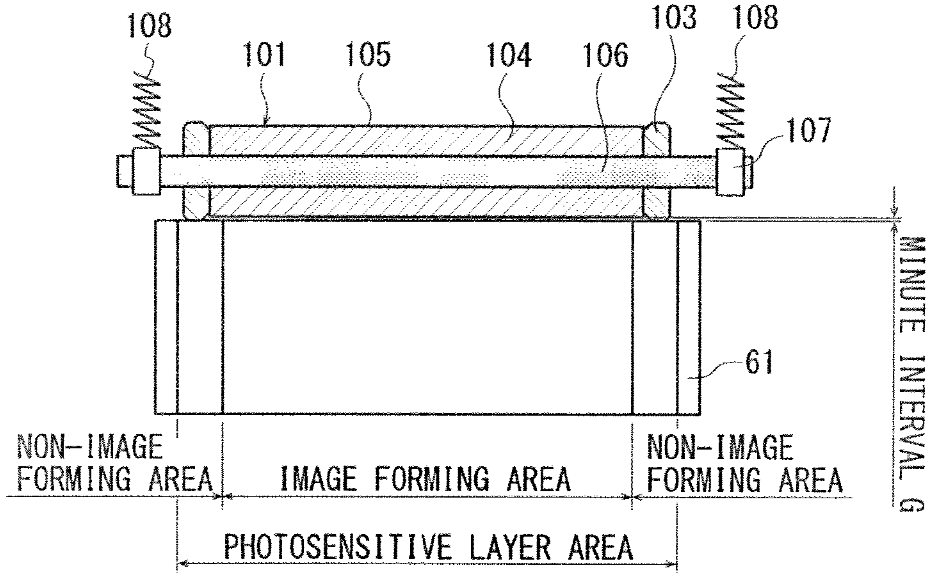
FIG. 8 is a view illustrating one example of a configuration of a charging member as a conductive member, and positional relationship of a photosensitive layer area, an image area and a non-image area of an image carrier.

FIG. 8 is a schematic view illustrating a charging member of one example of the conductive member which is evaluated by the conductive member evaluator and the conductive member evaluation method according to the embodiment of the present invention, and the positional relationship among a non-image area, an image area and a photosensitive layer area of an image carrier. Hereinafter, the conductive member which uses the charging member as the charging roller of a close charging method will be described, but the conductive member is not limited thereto.

The charging member 101 (i.e., charging roller 101), as illustrated in FIG. 8, includes the cylindrical bar-like solid conductive supporting body 106 made of a conductive metal such as stainless steel, the electric resistance adjusting layer 104 formed on the conductive supporting body 106 and a space holders 103 disposed in both ends of the electric resistance adjusting layer 104, respectively. The electric resistance adjusting layer 104 includes on the surface thereof the surface layer 105 so as to prevent the adhesion of toners and toner additive agent.

The charging roller 101 is disposed to face the image carrier 61 at a minute interval G (space). The space holders 103 have contact with the non-image forming area of the charging member 101, so that the interval G between the charging member 101 and the image carrier 61 is formed. The space holders 103 have contact with the photosensitive layer area, so that the variation of the space can be prevented if the application thickness of the photosensitive layer of the image carrier 61 varies.

The charging member 101 is formed in a cylindrical shape for the evaluation with the above-described conductive member evaluator. Since the charging member 101 is formed by a curved face which gradually separates from the closest portion to the image carrier 61 upstream and downstream of the moving direction of the image carrier 61, the image carrier 61 can be more uniformly charged. If the charging member 101 which faces the image carrier 61 has a shape portion, the electric potential in that portion becomes high, so that the discharge is prefentially started, and it becomes difficult to uniformly charge the image carrier 61. Accordingly, the image carrier 61 can be uniformly charged by a cylindrical shape having a curved face. The discharging surface of the charging roller 101 has strong stress. Since the discharge constantly generates on the same surface, the deterioration of the surface is developed, and the surface may be scraped. For this reason, if the entire surface of the charging member 101 can be used as a discharging surface, the early deterioration in the surface can be prevented by rotating the charging member 101, so that it can be used for a long period of time.

The interval G between the charging member 101 and the image carrier 61 is set to 100 μm or below, especially, within about 5-70 μm by the space holders 103. An abnormal image in the operation of the charger 100 can be thereby controlled. If the space G is 100 μm or above, the distance which reaches the image carrier 61 is increased, so that the discharge start voltage of Paschen's law is increased, and the discharge space to the image carrier 61 is increased. Accordingly, a lot of discharge products by the discharge are required in order to charge the image carrier 61, and a lot of discharge products remain in the discharge space after forming an image, and adhere to the image carrier 61, resulting in the aging deterioration in the image carrier 61. If this interval G is small, the distance to the image carrier 61 is short, so that the image carrier 61 can be charged even if the discharge energy is small. However, the space formed by the charging member 101 and the image carrier 61 is narrowed, and the air flow is deteriorated. Since the discharge products formed in the discharge space remain in this space, similar to the case in which the interval G is large, a lot of discharge products remain in the discharge space after forming an image, and adhere to the image carrier 61, resulting in the aging deterioration in the image carrier 61. Accordingly, it is preferable to form a space in which the generation of the discharge products is reduced by reducing the discharge energy and air does not remain. Consequently, it is preferable for the space G to be 100 μm or below and within a range of 5-70 μm. Thereby, the generation of the streamer discharge is prevented, and image spots and image deletion can be prevented by reducing the amount of discharge products which accumulates in the image carrier 61 with the reduced discharge product.

In this case, the toners remaining on the image carrier 61 after the development are cleaned by a cleaner 64 disposed to face the image carrier 61, but it is difficult to completely eliminate the toners. A small amount of toners passes through the cleaner, and is transferred to the charger 100. In this case, if the particle diameter of the toner is larger than the interval G, the toners are heated by being abraded, and may be fused on the charging member 101. This portion in which the toners are fused causes abnormal discharge which causes preferential discharge because this portion comes closer to the image carrier 61. Accordingly, it is preferable for the interval G to be larger than the maximum particle diameter of the toner for use in the image forming apparatus 1.

The charging member 101 is fitted to the bearings provided in the side plates of the not shown housing of the charger 100, and is pressed in the surface direction of the image carrier 61 by compression springs 108 provided in the bearings 107, which are made of a resin having a low friction coefficient and do not drive with the bearings. A predetermined interval G can be thereby formed even if mechanical vibration and the deflection of the cored bar are caused. The pressing load is 4-25N, preferably, 6-15N. Although the charging member 101 is fixed by the bearings 107, the size of the interval G is varied by the vibration in the rotation, the deviation of the charging member 101 and the asperity on the surface, and the interval G may depart from an appropriate range. Accordingly, the deterioration in the image carrier 61 is developed with times. In this case, the load means all load to be applied to the image carrier 61 via the space holders 103. This load can be adjusted by the force of the compression springs 108 provided in both ends of the charging member 101 and the own weight of the charging member 101 and the cleaning member 102, for example. If the load is small, the jumping by the fluctuation in the rotation of the charging member 101 and the impact of a driving gear or the like can not be controlled. If the load is large, the friction of the charging member 101 and the bearings 107 which are fitted to the charging member 101 is increased, so that the fluctuation is developed by increasing the aging wear volume. For this reason, by setting the load within a range of 4-25N, preferably, a range of 6-15N, the interval G can be appropriately set, the generation of the discharge products can be reduced, and the amount of the discharge products which deposit on the image carrier 62 can be reduced. Therefore, the operating life of the image carrier 61 can be extended, and a spotty abnormal image and image deletion can be prevented.

A part of each space holder 103 has a difference in height with respect to the electric resistance adjusting layer 104. The space can be formed by simultaneously processing the electric resistance adjusting layer 104 and the space holders 13 with an elimination process such as cutting or grinding. By simultaneously processing the space holders 103 and the electric resistance adjusting layer 104, the space can be formed with high accuracy.

The height of a part of the space holder 103 which is adjacent to the electric resistance adjusting layer 104 is set to the same as the height of the electric resistance adjusting layer 104 or set to lower than the height of the electric resistance adjusting layer 104, so that the contact width of the space holder 103 and the image carrier 61 is reduced, and the space between the charging member 101 and the image carrier 61 can be maintained with high accuracy. Consequently, the outer surface of the end portion of the space holder 103 on the electric resistance adjusting layer 104 side does not have contact with the image carrier 61, so that the leakage current which is caused by the contact of the electric resistance adjusting layer 104 to the image carrier 61 via the end portion can be prevented. By forming the end portion of the space holder 103 lower on the electric resistance adjusting layer 104 side, this portion can be used as a clearance for a cutting blade in the elimination process. In addition, the shape of this clearance can be any shape as long as the outer surface of the end portion of the space holder 103 does not have contact with the image carrier 61.

It is difficult to perform the masking when coating the surface layer 105 in the border of the electric resistance adjusting layer 104 and the space holder 103. The surface layer 105 can be effectively formed on the electric resistance adjusting layer 104 by forming the surface layer 105 to the space holder 103 which is formed in a height which is the same as the height of the electric resistance adjusting layer 104 or lower than the height of the electric resistance adjusting layer 104.

The space holder 103 is required to stably form the space with the image carrier 61 over a long period of time. To this end, it is desirable for the space holder 103 to be made of a material having a small hygroscopic property and abrasion resistance. Moreover, it is important for the material of the space holder 103 to have a property such that the toners and the toner additives do not easily adhere, and a property which does not abrade the image carrier 61 because the space holder 103 has contact with the image carrier 61 and slides. Accordingly, the material of the space holder 103 is appropriately selected in accordance with various conditions. The material of the space holder 103 includes general-purpose resin such as polyethylene (PE), polypropylene (PP), polyacetal (POM), polymethylmethacrylate (PMMA), polystyrene (PS), or copolymer of these (AS, ABS), polycarbonate (PC), urethane, or fluorine (PTFE). In order to effectively fix the space holder 103, the space holder 103 can be bonded by using adhesive agent. It is preferable for the space holder 103 to be made of an insulating material, and it is preferable for the insulating material to have a volume specific resistance of 10^13 Ωcm or more. By using the insulating material, the generation of leakage current with the image carrier 61 can be controlled. The space holder 103 is formed by a molding process.

It is preferable for the electric resistance adjusting layer 104 to be made of a thermoplastic resin composition in which a high-molecular form ion conductive material is dispersed. It is desirable for the volume specific resistance of the electric resistance adjusting layer 104 to be 10^6-10^9 Ωcm. If the volume specific resistance exceeds 10^9 Ωcm, the charging ability and the transfer ability are deteriorated. If the volume specific resistance is lower than 10^6 Ωcm, the leakage by the voltage concentration to the entire image carrier 61 is caused.

The thermoplastic resin for use in the electric resistance layer 104 is not specifically limited, but it is preferable to use general-purpose resin such as polyethylene (PE), polypropylene (PP), polymethylmethacrylate (PMMA), polystyrene (PS), or a copolymer of these (AS, ABS) in order to easily mold the electric resistance adjusting layer 104.

A high-molecular compound containing a polyetherester amide component is preferable as the high-molecular form ion conductive material which is dispersed in the thermoplastic resin. The polyetherester amide is an ion-conductive high-molecular material, and is evenly dispersed in matrix polymer on the molecular level and fixed. Accordingly, the variation of the resistance value with the dispersion error as seen in a composition in which conductive pigment is dispersed does not occur. Since the polyetherester amide is a high-molecular material, it hardly bleeds out. Regarding the compounding amount, it is preferable to have thermoplastic resin of 30-70% by weight and a high-molecular form ion conductive material of 70-30% by weight because a predetermined resistance value is required. In order to obtain a conductive mechanism by an ion conductive property, the electric resistance adjusting layer 104 is made of a resin material containing thermoplastic resin (A) containing in molecular at least polyamide elastomer and polyolefinblockpolymer, perchlorate and fluorine-containing organic anion salt. If an electronically conductive agent such as carbon black is used, the electric charge is generally discharged to the image carrier through the carbon black, so that minute uneven discharge resulting from the dispersed state of the carbon black can be easily generated, disturbing a high quality image. For this reason, the ion conductive property is required. This phenomenon becomes specifically remarkable when applying high voltage. The ion conductive material includes low-molecular weight salt such as alkali metal salt or ammonium salt, but it easily bleeds out by the polarization. Consequently, as a high-molecular form ion conductive material, solid polyamide elastomer containing an ether group or polyolefin block polymer is used. Having the ether group in molecular enables the stabilization of the salt by the oxygen atom in the ether binding and a high conductive performance. In this constitution, it is evenly dispersed and fixed in the matrix polymer on the molecular level, so that the variation of the conductive property with the dispersion error as seen in the composition in which conductive pigment is dispersed does not occur. Moreover, since it is a high-polymer material, it hardly bleeds out. The high-molecular form ion conductive material includes polyether polyols such as liquid polyethylene oxide having an ether group or polypropylene oxide. Since the liquid polyether polyols can not be evenly dispersed in the thermoplastic resin, solid polyamide elastomer or polyolefinblockpolymer is required. The polyamide elastomer and the polyolefinblockpolymer are generally classified into a hydrophilic grade and a hydrophobic grade, which significantly differ in features. In order to obtain a target feature, a plurality of grades can be blended. However, the conductive performance for use as a conductive member can not be obtained only by the thermoplastic resin material including polyamide elastomer and polyolefinblockpolymer. For this reason, electrolyte salt is used for improving the conductive performance. Perchlorate is most general as the electrolyte salt, and fluorine-containing organic anion salt, organic phosphonium salt or the like can be used.

Generally used salt can be used as the perchlorate. It is desirable to use salt selected from alkali metal salt and alkaline-earth metal salt in light of the conductive property. It is especially preferable to use lithium perchlorate or sodium perchlorate. As the fluorine-containing organic anion salt, salt including anion having a fluoro group (—F) and a sulfonyl group (—SO2-) is desirable. Regarding the salt including the anion, since the electric charge is delocalized by a strong electron suction effect by the fluoro group and the sulfonyl group, the anion shows a high dissociation degree in a stable polymer compound, and a high ion conductive performance can be achieved. In this case, alkali metal salt of bis (fluoroalkylsulfonyl) imide, alkali metal salt of tris (fluoroalkylsulfonyl) methide and alkali metal salt of fluoroalkylsulfone acid can easily decrease the resistance value. It is especially preferable to use high conductive lithium salt of lithium trifluoromethanesulfonate, bis(trifluoromethanesulfonyl) imide lithium and tris (trifluoromethanesulfonyl) methide lithium.

The perchlorate and the fluorine-containing organic anion salt can be added into a high-molecular form ion conductive material, and are kneaded, so that they can be blended in a predetermined ratio, and more than one type of electrolyte salt can be blended to each salt. As the high-molecular form ion conductive material containing perchlorate, for example, "IRGASTAT P18" made by Chiba Specialty Chemicals Co., Ltd. can be used and as the high-molecular form ion conductive material containing the fluorine-containing organic anion salt, for example, "SANCONOL" made by Sanko Chemical Ind. Co., Ltd. can be used. It is desirable for the salt to be blended in the high-molecular form conductive material at a rate of 0.01-20% by weight. If the blending amount is lower than 0.01% by weight, the conductive property is not sufficiently obtained. If the blending amount is higher than 20% by weight, it becomes difficult to be evenly dispersed in the resin composition. It is desirable for the volume-specific resistance of the resistance adjusting layer to be 10^6-10^9 Ωcm. If the volume-specific resistance exceeds 10^9 Ωcm, the charging ability and the transfer ability are not significantly obtained. If the volume-specific resistance is lower than 10^6 Ωcm, the leakage by the voltage concentration to the entire image carrier 61 is caused.

In order to obtain the above-described highly accurate conductive member, a machine process such as cutting and grinding is required. Since the polyamide elastomer and polyolefin block polymer are soft, it is difficult to process the polyamide elastomer and polyolefin block polymer by a machine. Consequently, they can be blended with another thermoplastic resin (B) having hardness higher than those resin if necessary. If the hardness is increased, a mechanical processing performance is improved. The high hardness thermoplastic resin (B) is not specifically limited, but general-purpose resin such as polyethylene (PE), polypropylene (PP), polymethylmethacrylate (PMMA), polystyrene (PS), or the copolymer of these (AS, ABS) or engineering plastic such as polycarbonate or polyacetal is preferable because it can be easily molded. The blending amount can be set according to the target mechanical processing performance as long as it is within a range which does not loose the conductive property of the electric resistance adjusting layer.

In order to improve the conductive performance of the electric resistance adjusting layer 104, the control of the dispersion state is important as well as the selection of the conductive resin material and the electrolyte salt. If the dispersion state of the electrolyte salt is rough, the uneven discharge resulting from the dispersion state under low temperature and low humidity environment easily occurs, resulting in an image error. Accordingly, in order to densify the dispersion state, it is preferable to add a compatibilizing agent. Such a compatibilizing agent includes graft copolymer (C) having affinity to the thermoplastic resin (A) containing the polyamide elastomer and the polyolefinblockpolymer. In particular, graft copolymer having polycarbonate resin in main chain and acrylic nitrile-styrene-glycidyl methacrylate copolymer in side chain is used. The acrylic nitrile-styrene-glycidyl methacrylate copolymer is made of an acrylic nitrile component, a styrene component and a glycidyl-methacrylate component of a reaction group. The glycidyl-methacrylate of a reaction group includes an epoxy group which reacts with the ester group and the amino group of (A) by the heating in the melting and kneading of the component, and chemically and strongly binds with (A). For this reason, by adding the graft copolymer, the dispersion state of the electrolyte salt is uniformed and densified. The generation of the uneven discharge with the dispersion error of the electrolyte salt can be thereby prevented. The dispersion state can be densified by setting the amount of the graft copolymer to 1-15% by weight relative to (A).

When blending the thermoplastic resin (A) and the high hardness thermoplastic resin (B), this graft copolymer functions as the compatibilizing agent. Since the polycarbonate resin of main chain includes a molecular structure having chain of a polar group and a dioxy group, the attractive force between molecules is very strong. For this reason, it is superior in dynamics intensity and a creep feature, and is it especially superior in impact strength compared to another plastic. Moreover, it has a low water-absorption property, so that the volume fluctuation with the water-absorption fluctuation is less. By these features, when using the polycarbonate resin as the main chain of the graft copolymer, the cracks by the mechanical and electrical stress and the aging volume fluctuation are hard to occur.

The styrene component and the acrylonitrile component of the side chain have preferable compatibility with (B). For this reason, if the affinity of (A) and (B) is low, the graft copolymer (C) functions as a compatible agent, and equalizes and densifies the dispersion state of (A) and (B). Therefore, the uneven conducting of the weld portion with the dispersion error of (A) and (B) the electrical and mechanical stress when using and the cracks generating in the weld portion of the resistance adjusting layer by the aging volume fluctuation can be controlled. As a result, a kneading resin composition which is superior in strength together with the effect of the main chain can be formed.

A method of manufacturing the resin composition is not specifically limited, and the resin component can be easily manufactured by melting and kneading the mixture of each material with a biaxial kneading machine, a kneader or the like. By providing a semiconducting resin composition on the conductive supporting body as the resistance adjusting layer by means of extrusion molding, injection molding, or the like, the resistance adjusting layer can be easily formed on the conductive supporting body.

If the charging member 101 is constituted by forming only the electric resistance adjusting layer 104 on the conductive supporting body 106, the toners, the toner additive or the like may adhere onto the electric resistance adjusting layer 104, resulting in the decrease in the performance of the charging member 101. Such a defect can be prevented by forming the surface layer 105 on the electric resistance adjusting layer 104.

The resistance value of the surface layer 105 is set to be larger than that of the electric resistance adjusting layer 104, so that the excessive discharge (leakage) and the voltage concentration to the defective portion of the image carrier 61 can be avoided. However, if the resistance value of the surface layer 105 is too high, the charging ability and the transfer ability are deteriorated. Accordingly, it is preferable for the difference between the resistance values of the surface layer 105 and the electric resistance adjusting layer 104 to be 3 orders or below.

As a material for forming a surface layer 105, a thermoplastic resin composition is preferable because it has a preferable film-forming performance. Specifically, fluorine resin, silicone resin, polyamide resin, polyester resin or the like is superior in a non-adhesive property, and is preferable in order to prevent the fixing of the toners. Since the resin material has an electric insulation property, the resistance of the surface layer is adjusted by dispersing various conductive materials to the resin. The surface layer is formed on the resistance adjusting layer by various coating methods such as spray painting, dipping or roll coating with paint made by melting the surface layer constitution material in organic solvent. It is preferable for the thickness of the surface layer to be about 10-30 μm.

Both of one-component paint and two-component paint can be used for the material of the surface layer 105. By using the two-component paint together with a hardening agent, the environment resistance, the non-adhesive property and the releasing property can be improved. When using the two-component paint, it is general to cross-link and harden the resin by heating the coating film. However, the since the resistance adjusting layer is thermoplastic resin, it can not be heated at a high temperature. As the two-component paint material, it is effective to use a base compound having a hydroxyl group in molecular and isocyanate resin which develops cross-linking reaction with the hydroxyl group. By using the isocyanate resin, the cross-linking and hardening reaction is developed at a relatively low temperature of 10° C. or below. After studying the non-adhesive property of the toners, it is confirmed that resin which is silicone resin and has a high non-adhesive property of toners is preferable, and acrylic silicone resin having an acrylic skeleton in molecular is specifically preferable.

Since the electric property of the charging roller 101 is important, it is necessary to apply a conductive property to the surface layer 105. The conductive property can be formed by dispersing conductive agent in a resin material. The conductive property is not specifically limited. Conductive carbon such as ketjenblack EC or acetylene black, carbon for rubber such as SAF, ISAF, HAF, FEF, GPF, SRF, FT or MT, carbon for color to which an oxidation treatment is applied, pyrolytic carbon, metal and metal oxide such as indium dope tin oxide (ITO), tin oxide, titanic oxide, zinc oxide, copper, silver, or germanium, conductive polymer such as polyaniline, polypyrrole, polyacetylen or the like can be used. A conductive applying member includes an ion conductive substance. The conductive applying member includes an inorganic ion conductive substance such as sodium perchlorate, lithium perchlorate, calcium perchlorate, or litium chloride, quaternized phosphonium salt such as ethyltriphenylphosphonium•tetrafluoroborate or tetraphenylphosphonium•bromide, or an organic ion conductive substance such as modified fatty acid dimethyl ammonium ethosulfate, stearic acid ammonium acetate, or laurylammonium acetate.

(Image Forming Apparatus)

Figure 9:
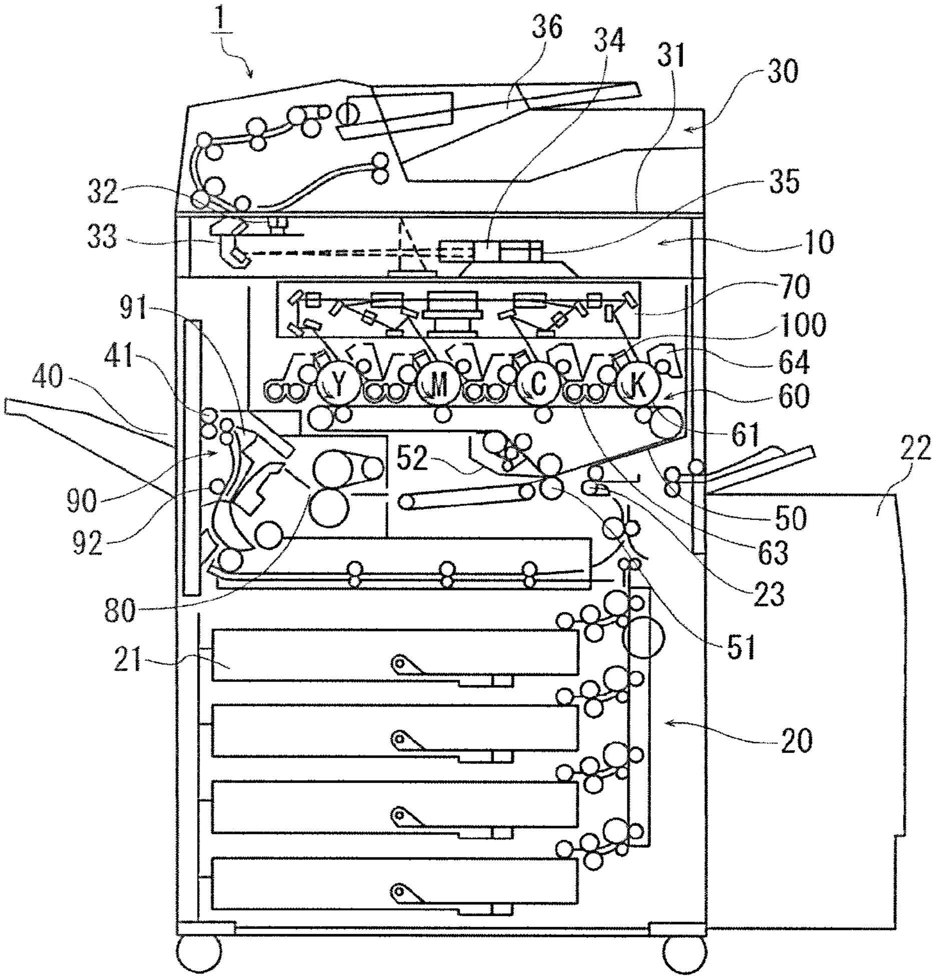
FIG. 9 is a configuration view illustrating a charger including a charging member and an image forming apparatus having the charger according to one embodiment of the present invention.
Figure 10:
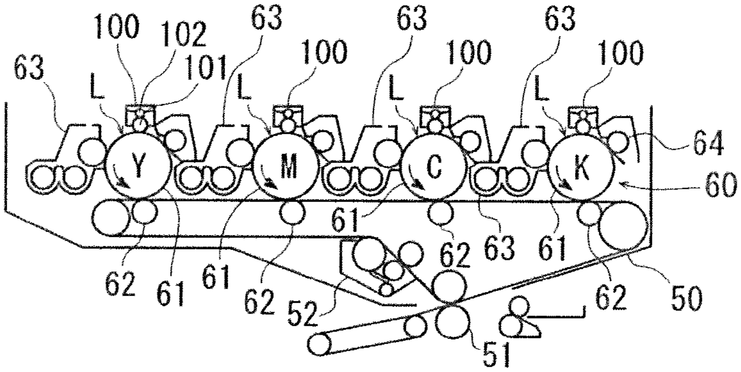
FIG. 10 is a configuration view illustrating an image forming section of the image forming apparatus in FIG. 9.
Figure 11:
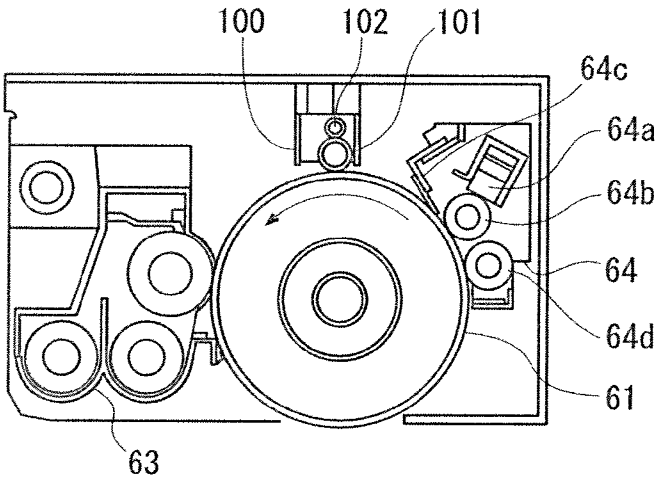
FIG. 11 is a configuration view illustrating a charger and a process cartridge according to one embodiment of the present invention.

FIG. 9 provides a schematic view illustrating a configuration of an image forming apparatus using a charger and a process cartridge including a charging member of a conductive member to be evaluated by the conductive member evaluator and the conductive member evaluation method according to the embodiment of the present invention. FIG. 10 provides a schematic view illustrating the configuration of the image forming portion of the image forming apparatus in FIG. 9. FIG. 11 provides a schematic view illustrating the configurations of the charger and the process cartridge. The process cartridge includes at least the image carrier 61, the charger 100 and the cleaner 64. As illustrated in FIG. 11, the process cartridge may include a development device 63. The process cartridge may be integrally detachable to the image forming apparatus.

The image forming apparatus 1 includes four drum-like image carriers 61 each having a photosensitive layer on the surface, the four drum-like image carriers corresponding to four colors, yellow (Y), magenta (M), cyan (C) and black (K), the charger 100 which uniformly charges each image carrier 61, an exposure device 70 which exposes the charged image carrier 61 with a laser beam to form an electrostatic latent image, the development device 63 which houses developer of four colors, yellow, magenta, cyan and black so as to form a toner image corresponding to the electrostatic latent image on the image carrier 61, a primary transfer device 62 which transfers the toner image on the image carrier 61, a belt-like intermediate transfer body 50 onto which the toner image on the image carrier 61 is transferred, a secondary transfer device 51 which transfers the toner image of the intermediate transfer body 50, a fuser which fuses the toner image on a recording medium onto which the toner image on the intermediate transfer body 50 is transferred, and the cleaner 64 which eliminates the toners remaining on the image carrier 61 after transferring. The recording medium is carried to a resist roller 23 by a carrying roller in a carrying path one by one from one of paper feeders 21, 22 which house the recording medium, and is carried to a transfer position in synchronization with the toner image on the image carrier.

As illustrated in FIG. 9, the exposure device 70 in the image forming apparatus 1 irradiates the image carrier 61 charged by the charger 100, and forms an electrostatic latent image on the image carrier 61 having a photoconductive property. The light L can be a laser light beam by a lamp such as a fluorescent lamp or a halogen lamp, a semiconductor element such as an LED or an LD, or the like. In this case, when irradiating in synchronization with the rotation speed of the image carrier 61 by signals from a not shown image processor, the LD element is used.

The development device 63 includes a developer carrier, carries the toners stored in the development device 63 to an agitation section with a supply roller, the toners are mixed and agitated with the developer including carriers, and the developer is transported to the development area facing the image carrier 61. In this case, the toners charged in a positive polarity or a negative polarity are transferred to the electrostatic latent image on the image carrier 61 to be developed. The developer can be a magnetic or non-magnetic one-component developer, can be a developer using both of magnetic and non-magnetic developer, or can be a wet developer.

The primary transfer roller 62 transfers the developed toner image on the image carrier 61 on the intermediate transfer body 50 by forming an electric field having a polarity opposite the polarity of the toners from the back side of the intermediate transfer body 50. The primary transfer device 62 can be a transfer device of a corona transfer device of corotron or scorotron, a transfer roller or a transfer brush. After that, the toner image is again transferred on the recording medium by the secondary transfer device 51 in synchronization with the recording medium which is fed from the paper feeder 22. In this case, the initial transfer can be directly performed on the recording medium without being transferred on the intermediate transfer body 50.

A fuser 80 fuses the toner image on the recording medium by heating or pressing the toner image on the recording medium. In this case, while passing between a pair of pressing and fusing rollers, the toner image is heated and pressed, and the toner image is fused while melting binding resin of the toners. The fuser 80 can be a belt-like fuser not a roller-like fuser, or can be a fuser which fuses by heart irradiation with a halogen lamp or the like. The cleaner 64 of the image carrier 61 cleans the toners remaining on the image carrier 61, and enables next image formation. The cleaner 64 can be a rubber blade made of urethane, for example or a fur fiber brush made of polyester, for example.

Hereinafter, the operation of the image forming device 1 will be described. A manuscript is set on a platen of a manuscript feeding section 36 or is set on a contact glass 31 by opening the manuscript feeding section 36, and the manuscript is held by closing the manuscript feeding section 36. Upon pressing a not shown start switch, the manuscript is fed on the contact glass 31 when the manuscript is set on the manuscript feeding portion 36, or first and second readers 32, 33 directly run when the manuscript is set on the contact glass 31. The light from the light source is emitted with the first reader 32, and the reflection light from the manuscript face is reflected toward the second reader 33, the light is reflected with a mirror of the second reader 33, so as to enter on a CCD 35 of a reading sensor through an imaging lens 34, and the image information is read. This read image information is sent to a controller. The controller irradiates writing laser light L toward the image carrier 61 by controlling a not shown LD or LED disposed in the exposure device 70 of the image forming section 60 according to the image information received from a reader 30. By this irradiation, the electrostatic latent image is formed on the surface of the image carrier 61.

A paper feeder 20 feeds a recording medium with a paper feeding roller from a plurality of paper feeding cassettes 21, sends the fed recording medium to a paper feeding path by separating with a separation roller, and feeds the recording medium to the paper feeding path of the image forming section 60 with the feeding roller. The paper can be manually fed, and a manual paper tray and a separation roller which separates the paper on the tray one by one toward a manual paper feeding path can be disposed in the side face of the apparatus. The resist roller 23 discharges one recording medium placed on the paper feeding cassette 21, and sends to the secondary transfer portion located between the intermediate transfer body 50 and the secondary transfer device 51. In the image forming section 60, after receiving the image information from the reader 30, the latent image is formed on the image carrier 61 by performing the above-described laser writing and the development process.

The developer in the development device 63 is held by a not shown magnetic pole, and forms a magnetic brush on the developer carrier. The developer is transported to the image carrier by development bias voltage which is applied to the developer carrier, visualizes the electrostatic latent image on the image carrier 61, so as to form a toner image. The development bias voltage is a voltage in which alternating voltage and direct voltage are superimposed. Next, in order to feed a recording medium having a size corresponding to the size of the toner image, one of the paper feeding rollers of the paper feeding section 20 is activated. With the activation of the paper feeding roller, one of the supporting rollers rotates by a driving motor, and the other two supporting rollers rotates, so that the intermediate transfer body 50 rotates. At the same time, the image carrier 61 rotates in each image forming unit, and a single color image of black, yellow, magenta or cyan is formed on the image carrier 61. With the carrying of the intermediate transfer body 50, the single color image is sequentially transferred to form a synthesized toner image on the intermediate transfer body 50.

Meanwhile, one of the paper feeding rollers of the paper feeder 20 is selected to rotate, the recording medium is fed from one of the paper feeding cassettes 21 to enter the paper feeding path by separating the recording medium one by one with the separation roller, is guided to the paper feeding path in the image forming section 60 of the image forming apparatus 1 with the feeding roller, and this recording medium hits the resist roller 23 to be stopped. Then, the resist roller 23 rotates in accordance with the synthesize toner image on the intermediate transfer body 50, sends the recording medium to the secondary transfer portion which is a contact portion of the intermediate transfer body 50 and the secondary transfer device 51, and the toner image is secondary transferred by the effect of the contact pressure and the secondary transfer bias formed on the secondary transfer portion and the toner image is recorded on the recording medium. In this case, it is preferable for the secondary transfer bias to be direct current. The recording medium after being transferring is fed to the fuser 80 with a transfer belt of the secondary transfer device, and the toner image is fused with the fuser 80 by the heat and pressure with the pressure roller. After that, the recording medium is discharged on the discharge tray 40 with the discharge roller 41.

In this case, the conductive member is used as the charging member. This will be described in details with reference to the charger 100.

The charger 100 includes the charging member 101 disposed to face the image carrier 61 at a minute interval G, the cleaning member 102 which cleans the charging member, a not shown power source which applies voltage to the charging member 101 and a not shown pressure spring which presses the charging member 101 to the image carrier 61 to have contact therewith. Both ends of the charging member 101 can be rotatably supported by gears or bearings.

Referring to FIGS. 10, 11, the surface of the image carrier 61 is uniformly charged by the charging member 101 in which the image forming area is disposed in a non-contact state, and is visualized by the development after forming an image (latent image), and the toner image is transferred onto the recording medium. The toners remaining on the image carrier 61 without being transferred onto the recording medium are collected by a supplemental cleaning member 64*d*. After that, in order to prevent the adhesion of the toner constitution materials and the toners on the surface of the image carrier 61, solid lubricant agent 64*a* is evenly applied on the image carrier 61 by an applying member 64*b* so as to form a lubricant agent layer. After that, the toners which are not collected by the supplemental cleaning member 64*d* are collected by a cleaning member 64*c*, and are fed to a waste toner collection portion. The supplemental cleaning member 64*d* is a roller shape or a brush shape. As the solid lubricant agent, agent which can apply non-adhesive property by reducing a friction coefficient on the image carrier is preferable such as fatty acid metal salt, for example, zinc stearate, or polytetrafluoroethylene. The cleaning member includes a rubber blade made of silicone or urethane or a fiber fur brush made of polyester.

The charger 100 includes a cleaning member 102 which eliminates the taint of the charging member 101. The cleaning member 102 can be any shape such as a roller shape or a pad shape, but in this embodiment, the cleaning member 102 includes a roller shape. The cleaning member 102 is fitted to a bearing provided in a not shown housing of the charger 100, so as to be rotatably supported. This cleaning member 102 has contact with the charging member 101, and cleans the outer circumferential face. If foreign matters such as toners, paper powder or a breakage of a member adhere on the surface of the charging member 101, the electric field concentrates in the foreign matter portion, so that abnormal discharge, which preferentially discharges, occurs. On the other hand, if electrically insulating foreign matter adheres on a wide range, the discharge does not occur in that portion, so that the charging spot is generated on the image carrier 61. Accordingly, it is preferable to provide in the charger 100 the cleaning member 102 which cleans the surface of the charging member 101. As the cleaning member 102, for example, a fiber brush made of polyester, or a sponge made of melamine resin can be used. The cleaning member may rotate with the charging member, rotate at a linear speed or rotate intermittently.

In this embodiment, the auxiliary cleaning member 64*d* is a brush roller. The zinc stearate is formed in a block shape, and the solid lubricant agent which is scraped from the solid lubricant agent block with the application roller is applied to the image carrier by pressing the brush roller of the application member with a pressure member such as a spring. The cleaning member 64*c* includes a counter method using a urethane blade. The cleaning member 102 of the charging member uses a sponge roller made of melamine resin, and rotates together with the charging member 101, so that the stain on the surface of the charging member 101 can be effectively cleaned.

The charger 100 includes a power source which applies voltage to the charging member 101. Only AC voltage can be used as the voltage, but it is preferable to use voltage in which DC voltage and AC voltage are superimposed. If the layer of the charging member 101 is an uneven portion, the surface potential of the image carrier 61 may become uneven when the DC voltage is only applied. By applying the superimposed voltage, the surface potential of the charging member 101 becomes even, so that the discharge is stabilized and the image carrier 61 can be uniformly charged. It is preferable for the AC voltage in the superimposed voltage to be 2 times or more of the charging start voltage of the image carrier 61. The charging start voltage is an absolute value of voltage when starting the charging of the image carrier 61 when applying only DC voltage to the charging member 101. Accordingly, the back discharge occurs to the charging member 101 from the image carrier 61, and the image carrier 61 can be uniformly charged with a further stabilized state by the averaging effect. It is desirable for the frequency of the AC voltage to be 7 times or more of the peripheral velocity (process speed) of the image carrier. If the frequency is set to 7 times or more, the moiré image can be eliminated.

(Examination of Present Invention)

The present inventors manufactured the undesirable charging roller 101 (hereinafter, referred to as a charging roller X), which causes regional uneven concentration when forming an image with an image forming apparatus, and the desirable charging roller 101 (hereinafter, referred to as a charging roller Y) which does not cause regional uneven concentration. These charging rollers X, Y were evaluated by the evaluation methods illustrated in the following examples and comparison examples. Then, these evaluation results are compared to the evaluation result of an actually formed image, so as to examine whether or not the conductive member is accurately evaluated by the present invention.

The following charging roller was used for the examination.

(Charging Roller X)

An electric resistance adjusting layer (300 mm in total length) was formed on a stainless conductive supporting body (8 mm in outer diameter) by covering the conductive supporting body with a resin composition (volume specific resistance: 2×10^ 8 Ωcm) in which the following A, B, C were melted and kneaded at 220° C. by means of injection molding.

A: IRGASTAT P18 (made by Chiba Specialty Chemicals, Co., Ltd.) 60 pts. wt. (above, polyamide elastomer, A contains perchlorate)

B: ABS resin (DENKA ABS GR-3000 made by Denki Kagaku Kogyo Co., Ltd.) 40 pts. wt.

With respect to 100 pts. wt. of the mixture of A and B,

C: Polycarbonate-glycidylmethacrylate-styrene-acrylonitrile copolymer (MODIPER C L440-G made by MOF CORPORATION) 4.5 pts. wt. (Graftcopolymer)

Next, the electric resistance adjusting layer was simultaneously finished to 12.7 mm in outer diameter by a cutting process.

Then, after diluting paint made of the mixture of acrylic modification silicone resin (Mukicoat 3000VH made by Kawakami Paint MFG. Co., Ltd.), ion conductive agent (PEL20A, Japan Cartridge, Co., Ltd.) and isocyanate resin (T4 curative agent made by Kawakami Paint MFG. Co., Ltd.) with diluting solvent made of butyl acetate, toluene and MEK, a surface layer about 10 μm in thickness was formed on the surface of the electric resistance adjusting layer by spray painting, and the charging roller X was obtained through a burning process.

(Charging Roller Y)

A tubular molding product (9.8 mm in inner diameter) was manufactured by extrusion-molding the resin composition in which the above A, B and C used in the charging roller X were melted and kneaded, and then an electric resistance adjusting layer was formed by pressing a stainless conductive supporting body (10 mm in outer diameter) into the molding product.

Next, similar to the charging roller X, the electric resistance adjusting layer was simultaneously finished to 12.7 mm in outer diameter by a cutting process.

Then, similar to the charging roller X, after diluting paint made of the mixture of acrylic modification silicone resin (Mukicoat 3000 VH made by Kawakami Paint MFG. Co., Ltd.), ion conductive agent (PEL20A made by Japan Cartridge, Co., Ltd.) and isocyanate resin (T4 curative agent made by Kawakami Paint MFG. Co., Ltd.) with diluting solvent made of butyl acetate, toluene and MEK, a surface layer about 10 μm in thickness was formed on the surface of the electric resistance adjusting layer by spray paint, and the charging roller X was obtained through a burning process.

Embodiment 1

In the atmosphere of 50% RH and the measurement environment of 23° C., the charging rollers X, Y before distributing power (i.e., initial state), which were not used for forming an image, were attached to the conductive member evaluator 200 illustrated in FIG. 1 as the charging roller 101. Then, the first electrode 211 (electrodes 211A, 211B: 10 mm in outer diameter, 4 mm in thickness) was connected to the outer circumferential face 101*a* of the charging roller 101, and the second electrode 221 was connected to the conductive supporting body 106 of the charging roller 101, and the charging roller 101 and the first electrode 211 rotated in opposite directions each other at a linear speed of 40 mm/sec. In this state, the DC voltage of Vdc=−0.7 kV, the voltage between peaks (AC voltage) Vpp=1.0 kV and voltage (i.e., evaluation voltage) of 300 Hz in frequency f were applied between the first electrode 211 and the second electrode 221 from the power source 205 (10/10B made by TREK JAPAN CO., LTD.). Then, the measuring portion 206 (USB data collecting system NR-2000 made by KEYENCE CORPORATION) was connected to the monitoring terminal of the power source 205, the current value and the voltage value (i.e., evaluation current and evaluation voltage) output by the power source 205 with the sampling rate of 10 kHz were measured (sampled). In the controller 207, the date (information) regarding the evaluation voltage and the evaluation current measured in the measuring portion 206 was loaded, and the extreme value of the alternating component in the evaluation current was obtained. Then, the difference value D between the maximum value and the minimum value of the extreme value in one rotation period (rotation cycle T1) of the charging roller 101 was calculated. After that, the first electrode 211 was moved in the axial direction of the charging roller 101, and the calculation of the difference value D was performed for the entire portion of the outer circumferential face 101*a* of the charging roller 101 in the axial direction (i.e., the entire outer circumferential surface 101*a*). Then, the difference value D was compared to the previously defined standard difference value Dt. If all of the difference values D are the standard difference value Dt or below, the charging roller 101 is determined as a desirable charging roller which does not cause regional uneven concentration. If any of the difference values D is larger than the standard difference value Dt, the charging roller 101 is determined as an undesirable charging roller which causes regional uneven concentration.

Embodiment 2

The charging rollers X, Y were evaluated similar to Embodiment 1 except that the voltage between peaks was Vpp=1.5 kV.

Embodiment 3

The charging rollers X, Y were evaluated similar to Embodiment 1 except that the voltage between peaks was Vpp=2.2 kV.

Embodiment 4

The charging rollers X, Y were evaluated similar to Embodiment 1 except that the DC voltage was Vdc=0.7 kV and the maximum value of the alternating component in the evaluation current was used.

Embodiment 5

The measurement similar to Embodiment 1 was performed to the charging rollers X, Y by using an acceleration test device in which the image forming apparatus illustrated in FIG. 9 was converted after performing a conducting rotation test without feeding paper for 120 hours (corresponding to 150000 copies) (i.e., after distributing power) in the environment of 23° C., 50% RH.

Comparison Example 1

Figure 14:
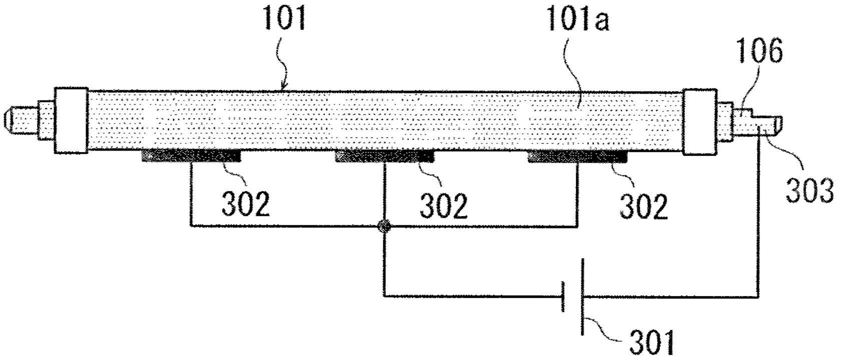
FIG. 14 is a configuration view illustrating a conventional conductive member evaluator.
Figure 15:
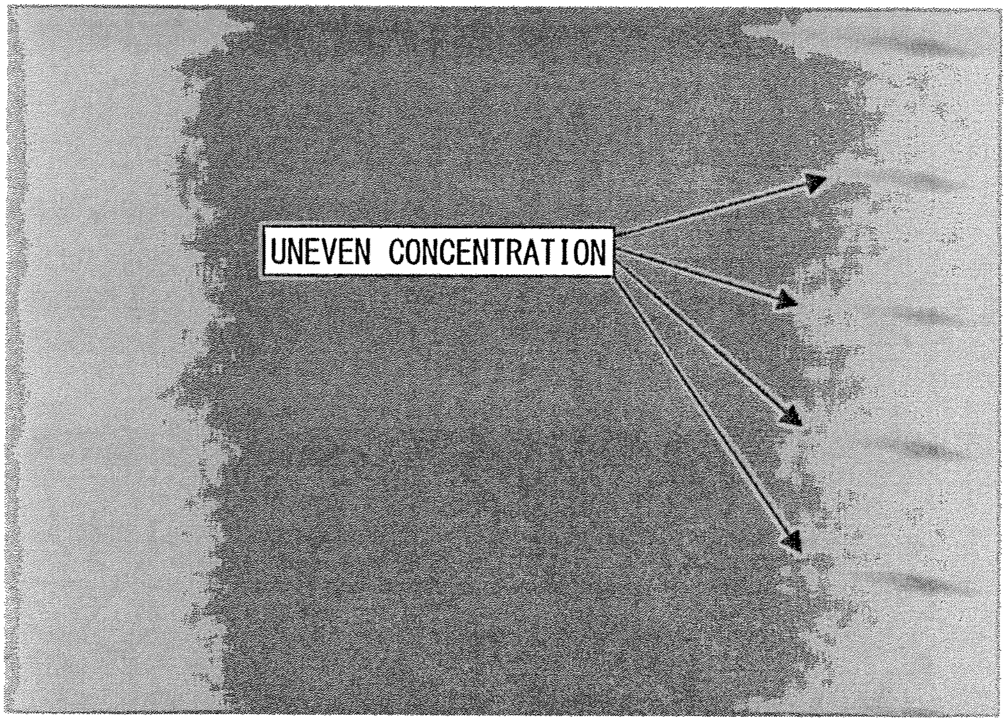
FIG. 15 is a view illustrating one example of an image including local uneven concentration.

In the atmosphere of 50% RH and the measurement environment of 23° C., a plurality of bar-like conductive rubber electrodes was brought into contact with the outer circumferential face 101*a* of the charging roller 101 in a resting state in the axial direction as illustrated in FIG. 14, and the resistance measurement was performed in a state in which DC voltage was applied between a plurality of bar-like conductive rubber electrodes and the electrode connected to the conductive supporting body 106. The DC voltage of 0.1 kV was applied to the charging roller 101 from a digital ultrahigh resistance/minute electric current meter (R8340A made by ADVANTEST CORPORATION), and the roller resistance value was calculated from the value after 15 seconds. Then, this resistance value was compared to the previously defined standard resistance value. If the resistance value is the standard resistance value or below, the charging roller 101 is determined as a desirable charging roller which does not cause regional uneven concentration. If the resistance value is larger than the standard resistance value, the charging roller 101 is determined as an undesirable charging roller which causes regional uneven concentration.

Comparison Example 2

The above charging rollers X, Y were evaluated similar to Comparison Example 1 except that the DC voltage of 0.7 kV was applied.

Comparison Example 3

The above charging rollers X, Y were evaluated similar to Comparison Example 1 except that the DC voltage Vdc=−0.7 kV, the voltage between peaks Vpp=2.2 kV and the voltage of 300 Hz in frequency f were applied.

(Comparison Example 4)

The above charging rollers X, Y were evaluated similar to Comparison Example 1 except that the DC voltage Vdc=0.7 kV, the voltage between peaks Vpp=0 V and the frequency f=0 Hz were applied (namely, only the DC voltage Vdc was applied).

Comparison Example 5

In the atmosphere of 50% RH and the measurement environment of 23° C., the charging rollers X, Y before distributing power, which were not used for forming an image, were used as the charging roller 101, this charging roller 101 was disposed parallel to the photoconductor 40 mm in outer diameter and 320 mm in total length to have contact therewith, and each of the charging roller and the photoconductor was rotated in opposite directions each other at a linear speed of 282 mm/sec. In this state, the DC voltage of Vdc=−0.7 kV, the voltage between peaks Vpp=2.2 kV and voltage (i.e., evaluation voltage) of 2.2 kHz of frequency f were applied to the charging roller 101 from a high voltage power source (10/10B made by TREK JAPAN CO., LTD.). Then, a USB data collecting system (NR-2000 made by KEYENCE CORPORATION) was connected to the monitoring terminal of the high voltage power source, the voltage value and the current value (i.e., evaluation current and evaluation voltage) output by the high voltage power source were measured (sampled) with the sampling rate of 200 kHz. The data (information) regarding the evaluation voltage and the evaluation current measured by the USB data collecting system were loaded in a personal computer, and the current waveform area in one rotation period of the charging roller 101 in the evaluation current was calculated. Then, this current waveform area was compared to a previously defined standard area value. If the current waveform area is the standard area value or more, the charging roller 101 is evaluated as a desirable charging roller which does not cause regional uneven concentration. If the current waveform area is smaller than the standard area value, the charging roller 101 is evaluated as an undesirable charging roller which causes regional uneven concentration.

Comparison Example 6

In the atmosphere of 50% RH and the measurement environment of 23° C., the charging rollers X, Y before distributing power, which were not used for forming an image, were used as the charging roller 101, this charging roller 101 was disposed parallel to the photoconductor 40 mm in outer diameter and 320 mm in total length to have contact therewith, and each of the charging roller and the photoconductor were rotated in opposite directions each other at a linear speed of 282 mm/sec. In this state, the DC voltage of Vdc=−0.7 kV, the voltage between peaks Vpp=2.2 kV and the voltage (i.e., evaluation voltage) of 2.2 kHz of frequency f were applied to the charging roller 101 from a high voltage power source (10/10B made by TREK JAPAN CO., LTD.). Then, the USB data collecting system (NR-2000 made by KEYENCE CORPORATION) was connected to the monitoring terminal of the high voltage power source, the voltage value and the current value (i.e., evaluation current and evaluation voltage) output by the high voltage power source were measured (sampled) with the sampling rate of 200 kHz. The data (information) regarding the evaluation voltage and the evaluation current measured by the USB data collecting system were loaded in a personal computer, a rising phase difference α1 and a falling phase difference α2 of the evaluation voltage and the evaluation current when setting the DC voltage Vdc of the evaluation voltage and OA of the evaluation current were set to each central value were calculated. Then, the difference between the rising phase difference α1 and the falling phase difference α2 (namely, measurement value) was obtained. This difference was compared to a previously defined standard value. If this difference is the standard value or below, the charging roller 101 is evaluated as a desirable charging roller which does not cause regional uneven concentration, and if this difference is larger than the standard value, the charging roller 101 is evaluated as an undesirable charging roller which causes regional uneven concentration.

Except for the evaluation in the above-described embodiments and comparison examples, the charging rollers X, Y were incorporated into the above-described image forming apparatus, and a solid image having predetermined concentration was formed, and this solid image was visually evaluated. The charging roller X was evaluated as a desirable roller which could form a desirable image without having regional uneven concentration. The charging roller Y was evaluated as an undesirable roller which formed an undesirable image having regional uneven concentration.

The evaluation results of the charging rollers X, Y in the above-described embodiments and comparative examples were compared to the evaluation results of actually formed image by using the charging rollers X, Y, and the embodiments and comparative examples were evaluated based on the following evaluation standards.

Evaluation Standard Corresponding to Image Evaluation

○: The evaluation result of the charging roller conforms to the image evaluation result.

x: The evaluation result of the charging roller does not conform to the image evaluation result.

Evaluation Standard of Total Evaluation

○: The charging roller can be accurately evaluated regarding regional uneven concentration.

x: The charging roller can not be accurately evaluated regarding regional uneven concentration.

Tables 1, 2 are tables in which the evaluation configurations or the like of the embodiments and the comparison examples are compared, and Table 3 indicates the evaluation results in each embodiment and each comparison example.

TABLE 1

| | EVALUATION METHOD | AC VOLTAGE Vpp (kV) | DC VOLTAGE Vdc (kV) | LINEAR SPEED V (mm/sec) | FREQUENCY LINEAR SPEED RATIO | AC FREQUENCY f (kHz) |
|---|---|---|---|---|---|---|
| EMBODIMENT 1 | EVALUATION BY CURRENT MINIMUM VALUE/ MAXIMUM VALUE | 1.0 | −0.7 | 40 | 7.5 | 0.3 |
| EMBODIMENT 2 | ↑ | 1.5 | ↑ | ↑ | ↑ | ↑ |
| EMBODIMENT 3 | ↑ | 2.2 | ↑ | ↑ | ↑ | ↑ |
| EMBODIMENT 4 | ↑ | 1.0 | 0.7 | ↑ | ↑ | ↑ |
| EMBODIMENT 5 | ↑ | ↑ | −0.7 | ↑ | ↑ | ↑ |

TABLE 1-continued

| | EVALUATION METHOD | AC VOLTAGE Vpp (kV) | DC VOLTAGE Vdc (kV) | LINEAR SPEED V (mm/sec) | FREQUENCY LINEAR SPEED RATIO | AC FREQUENCY f (kHz) |
|---|---|---|---|---|---|---|
| COMPARISON EXAMPLE 1 | ROLLER RESISTANCE (STATIC) | 0 (ONLY DC) | 0.1 | — | — | — |
| COMPARISON EXAMPLE 2 | ↑ | ↑ | 0.7 | — | — | — |
| COMPARISON EXAMPLE 3 | ↑ | 2.2 | −0.7 | — | — | 0.3 |
| COMPARISON EXAMPLE 4 | EVALUATION BY CURRENT MINIMUM VALUE/ MAXIMUM VALUE | 0 (ONLY DC) | 0.7 | 40 | — | — |
| COMPARISON EXAMPLE 5 | CURRENT WAVEFORM AREA | 2.2 | −0.7 | 282 | 7.8 | 2.2 |
| COMPARISON EXAMPLE 6 | PHASE DIFFERENCE | ↑ | ↑ | ↑ | ↑ | ↑ |

TABLE 2

| | ROLLER ROTA-TION | ROLLER CONDITION | SPACE (μm) | SAM-PLING RATE (kHz) |
|---|---|---|---|---|
| EMBODIMENT 1 | YES | BEGINNING | 0 (CONTACT) | 10 |
| EMBODIMENT 2 | ↑ | ↑ | ↑ | ↑ |
| EMBODIMENT 3 | ↑ | ↑ | ↑ | ↑ |
| EMBODIMENT 4 | ↑ | ↑ | ↑ | ↑ |
| EMBODIMENT 5 | ↑ | AFTER DISTRIB-UTING POWER | ↑ | ↑ |
| COMPARISON EXAMPLE 1 | NO | BEGINNING | 0 (CONTACT) | — |

TABLE 2-continued

| | ROLLER ROTA-TION | ROLLER CONDITION | SPACE (μm) | SAM-PLING RATE (kHz) |
|---|---|---|---|---|
| COMPARISON EXAMPLE 2 | ↑ | ↑ | ↑ | — |
| COMPARISON EXAMPLE 3 | ↑ | ↑ | ↑ | — |
| COMPARISON EXAMPLE 4 | YES | ↑ | ↑ | 10 |
| COMPARISON EXAMPLE 5 | ↑ | ↑ | ↑ | 200 |
| COMPARISON EXAMPLE 6 | ↑ | ↑ | ↑ | ↑ |

TABLE 3

| | EVALUATION METHOD | ELECTRIC PROPERTY EVALUATION STANDARD | ELECTRIC PROPERTY EVALUATION RESULT | CORRESPONDENCE WITH IMAGE EVALUATION | TOTAL EVALUATION |
|---|---|---|---|---|---|
| EMBODIMENT 1 | EVALUATION BY CURRENT MINIMUM VALUE/ MAXIMUM VALUE | DESIRABLE IF FLUCTUATION IS SMALL IN ROLLER CYCLE | VARIATION OF ROLLER X < VARIATION OF ROLLER Y | ○ | ○ |
| EMBODIMENT 2 | ↑ | ↑ | ↑ | ○ | ○ |
| EMBODIMENT 3 | ↑ | ↑ | ↑ | ○ | ○ |
| EMBODIMENT 4 | ↑ | ↑ | ↑ | ○ | ○ |
| EMBODIMENT 5 | ↑ | ↑ | ↑ | ○ | ○ |
| COMPARISON EXAMPLE 1 | ROLLER RESISTANCE (RESISTANCE CALCULATION FROM CURRENT VALUE) | DESIRABLE IF RESISTANCE VALUE IS SMALL | NO DIFFERENCE BETWEEN ROLLERS X, Y | x | x |
| COMPARISON EXAMPLE 2 | ↑ | ↑ | UNMEASURABLE STATE BY LEAKAGE | x | x |
| COMPARISON EXAMPLE 3 | ↑ | ↑ | ↑ | x | x |
| COMPARISON EXAMPLE 4 | EVALUATION BY CURRENT MINIMUM VALUE/ MAXIMUM VALUE | DESIRABLE IF FLUCTUATION IS SMALL IN ROLLER CYCLE | NO DIFFERENCE BETWEEN ROLLERS X, Y | x | x |
| COMPARISON EXAMPLE 5 | CURRENT WAVEFORM AREA | DESIRABLE IF WAVEFORM AREA IS LARGE | ↑ | x | x |
| COMPARISON EXAMPLE 6 | PHASE DIFFERENCE | DESIRABLE IF DIFFERENCE OF RISING/ FALLING IS SMALL | ↑ | x | x |

The following matters become apparent by the evaluation results illustrated in each table. In the conventional evaluation methods (Comparison Examples 1, 2, 3) which measured a resistance value by bringing the electrode into contact with the charging roller in a resting state, the charging rollers X, Y were not accurately evaluated regardless of applying voltage, for example, DC voltage or voltage in which AC voltage was superimposed to DC voltage. Specifically, in Comparison Example 1, even if the position of the charging roller Y to which the electrode has contact was changed, the difference in the resistance values (i.e., the regional difference in the electric property) was not detected. A single reason for not detecting the difference was considered to be because one electrode was not brought into contact with a regional part of the outer circumferential face of the charging roller. In Comparative Examples 2, 3, high voltage was applied to the charging roller in a resting state, so that leakage current was regionally generated, resulting in an unmeasurable state due to the discharge damage.

In Comparison Example 4, similar to Embodiment 1, the first electrode 211 was brought into contact with a regional part of the outer circumferential face 101*a* of the charging roller 101. and the DC voltage was applied, such that the contact portion moved in the circumferential direction of the outer circumferential face and the current value was measured. However, the waveforms of the measured evaluation current did not remarkably differ between the charging rollers X, Y. In the actual charging process, since the voltage including an alternating component is applied to the charging roller 101, it is considered that it is necessary to consider the reactance which becomes resistance to the AC voltage as the electric property. However, if the DC voltage is applied as Comparison Example 4, the reactance is not confirmed. Accordingly, in the evaluation method which applies only DC voltage, the charging rollers X, Y are not accurately evaluated.

In Comparison Examples 5, 6, the charging roller was evaluated based on the current value flowing between the charging roller and the photoreceptor by the discharge over the entire charging roller in the axial direction, so that the discharge could not be performed in a regional part of the outer circumferential face of the charging roller, and the entire outer circumferential face of the charging roller was evaluated in the axial direction. Accordingly, a remarkable difference was not generated in the measured current waveform areas and the phase difference of the evaluation voltage and the evaluation current for the charging rollers X, Y, so that the charging rollers X, Y were not accurately evaluated.

Figure 12:
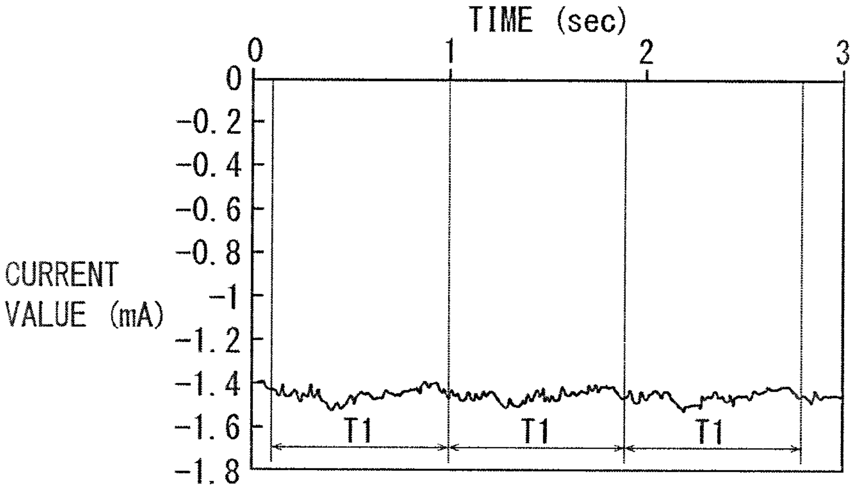
FIG. 12 is a graph illustrating one example of change of a minimum value in one cycle of an AC component in evaluation current obtained for the desirable charging roller which does not cause local uneven concentration on an image in Embodiment 1.
Figure 13:
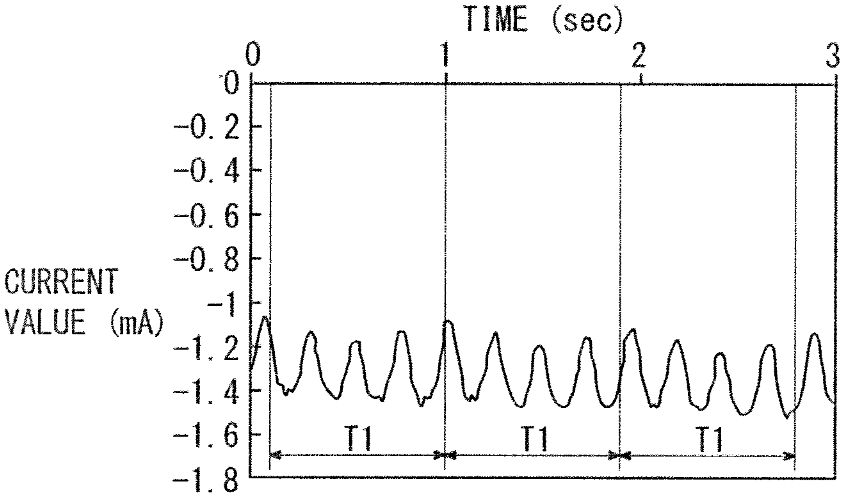
FIG. 13 is a graph illustrating one example of change of a minimum value in one cycle of an AC component in evaluation current obtained for the undesirable charging roller which does not cause local uneven concentration on an image in Embodiment 1.

In Embodiments 1-5, the evaluation result in each embodiment accurately conformed to the evaluation result based on an image. As reference, FIGS. 12, 13 illustrate the waveform of the minimum value obtained for the charging rollers X, Y in Embodiment 1. As illustrated in FIG. 12, the variation of the minimum value in the entire outer circumferential face was small for the charging roller X, and the waveform illustrating a desirable electric property was obtained. The variation of the minimum value was large by a part of the outer circumferential face for the charging roller Y, and the waveform illustrating an undesirable electric property was obtained. In Embodiments 2-4, it is confirmed that if the negative and positive of the voltage value (Vdc) of the DC component in the evaluation voltage were inverted (−0.7 V or 0.7 V), or the amplitude (Vpp) of the AC component is changed (1.0 kV-2.2 kV), the evaluation results is not affected. Moreover, in Embodiment 5, it is confirmed that both of the charging roller in the initial state and the charging roller after distributing power can be accurately evaluated.

As described above, according to the conductive member evaluator and the conductive member evaluation method of the embodiment of the present invention, the charging roller 101 as the conductive member can be accurately evaluated.

According to the embodiment of the present invention, the cylindrical or spherical first electrode is brought into contact with the outer circumferential face of the roller-like conductive member rotating about the shaft center, rotates in the direction opposite the conductive member, and is connected to the outer circumferential face of the conductive member, and the second electrode is connected to the shaft center of the conductive member. The evaluation voltage including the AC component is applied between these electrodes, and the current value between these electrodes, namely, between the contact portion of the first electrode in the outer circumferential face of the conductive member moving in the circumferential direction with the rotation and the shaft center. Then, the extreme value (maximum value and/or minimum value) in one cycle of the AC component from the measured current value is obtained, and the conductive member is evaluated based on this extreme value.

According to the embodiment of the present invention, the difference value between the maximum value and the minimum value of the extreme value in a predetermined evaluation period is calculated. The conductive member is evaluated based on the result in which the difference value is compared to a previously defined standard difference value.

According to the embodiment of the present invention, the deviation of the extreme value in a predetermined evaluation period is calculated. The conductive member is evaluated based on the result in which the deviation is compared to a previously defined standard deviation value.

According to the embodiment of the present invention, the variation of the extreme value per unit time in a predetermined evaluation period is calculated. The conductive member is evaluated based on the result in which the variation is compared to a previously defined standard variation value.

According to the embodiment of the present invention, the evaluation period is one rotation period of the conductive member.

According to the embodiment of the present invention, since the current value flowing between the contact portion of the first electrode in the outer circumferential face of the conductive member moving in the circumferential direction with the rotation and the shaft center is measured, the extreme value (maximum value and/or um value) in one cycle of the AC component included in the current value indicates the electric property of the contact portion of the first electrode in the outer circumferential face of the conductive member, namely, the electric property of a local part of the outer circumferential face of the conductive member. Consequently; by using the extreme value obtained from the measured current value while moving the local part of the outer circumferential face in the circumferential direction, the local difference of the electric property in the outer circumferential face of the conductive member can be detected; thus, the conductive member can be evaluated for local uneven concentration.

According to the embodiment of the present invention, the difference value of the maximum value and the minimum value of the extreme value in a predetermined evaluation period is calculated, and the conductive member is evaluated based on the result in which the difference value is compared to a previously defined standard difference value. Consequently, one of the maximum value and the minimum value of the extreme value corresponds to a portion having high concentration and the other corresponds to a portion having low concentration. Accordingly, the conductive member can be evaluated based on the concentration difference in local uneven concentration.

According to the embodiment of the present invention, the deviation of the extreme value in a predetermined evaluation period is calculated, and the conductive member is evaluated based on the result in which the deviation is compared to a previously defined standard deviation value.

According to the embodiment of the present invention, the variation of the extreme value per unit time in a predetermined evaluation period is calculated, and the conductive member is evaluated based on the result in which the variation is compared to a previously defined standard variation value. The variation of the extreme value per unit time indicates the inclination of local change of the electric property of the outer circumferential face of the conductive member. If this inclination is large, the change in the uneven concentration is rapid, and if this inclination is small, the change in the uneven concentration is small. Accordingly, the conductive member can be evaluated according to the concentration change in the uneven concentration of an image.

According to the embodiment of the present invention, since the evaluation period is one rotation period of the conductive member, the conductive member can be evaluated by detecting the local difference of the electric property over the entire circumferential direction of the conductive member.

Although the embodiment of the present invention has been described above, the present invention is not limited thereto. It should be appreciated that variations may be made in the embodiment described by persons skilled in the art without departing from the scope of the present invention.

What is claimed is:

1. A conductive member valuator, comprising:

a cylindrical or spherical first electrode which has contact with an outer circumferential face of a roller-like conductive member rotating about a shaft center, and configured to rotate in a direction opposite the conductive member;

a second electrode which is connected to the shaft center of the conductive member;

a voltage applier configured to apply evaluation voltage including at least an AC component between the first electrode and the second electrode;

a current value measuring device configured to measure a current value flowing between the first electrode and the second electrode when the evaluation voltage is applied by the voltage applier;

an extreme value obtaining device configured to obtain at least one value amongst a maximum value and a minimum value in one cycle of the AC component included in the current value from the current value measured by the current value measuring device; and an evaluation device configured to evaluate the conductive member based on said at least one value obtained by the extreme value obtaining device, wherein the evaluation device is configured to calculate a difference value between the maximum value and the minimum value, in a predetermined evaluation period, obtained by the extreme value obtaining device, and evaluate the conductive member based on a result in which the difference value is compared to a previously defined standard difference value.

2. The conductive member evaluator according to claim 1, wherein the evaluation device is configured to calculate a deviation of the obtained value, in a predetermined evaluation period, obtained by the extreme value obtaining device, and evaluate the conductive member based on a result in which the deviation is compared to a previously defined standard deviation value.

3. A conductive member evaluator, comprising:

a cylindrical or spherical first electrode which has contact with an outer circumferential face of a roller-like conductive member rotating about a shaft center, and configured to rotate in a direction opposite the conductive member;

a second electrode which is connected to the shaft center of the conductive member;

a voltage applier configured to apply evaluation voltage including at least an AC component between the first electrode and the second electrode;

a current value measuring device configured to measure a current value flowing between the first electrode and the second electrode when the evaluation voltage is applied by the voltage applier;

an extreme value obtaining device configured to obtain at least one value amongst a maximum value and a minimum value in one cycle of the AC component included in the current value from the current value measured by the current value measuring device; and an evaluation device configured to evaluate the conductive member based on said at least one value obtained by the extreme value obtaining device, wherein the evaluation device is configured to calculate a variation of the obtained value, per unit time in a predetermined evaluation period, obtained by the extreme value obtaining device, and evaluate the conductive member based on a result in which the variation is compared to a previously defined standard variation value.

4. The conductive member evaluator according to claim 1, wherein the evaluation period is one rotation period of the conductive member.

5. The conductive member evaluator according to claim 2, wherein the evaluation period is one rotation period of the conductive member.

6. The conductive member evaluator according to claim 3, wherein the evaluation period is a one rotation period of the conductive member.

7. A conductive member evaluation method, comprising:

a voltage applying step of applying evaluation voltage including at least an AC component between a cylindrical or spherical first electrode which has contact with an outer circumferential face of a roller-like conductive member rotating about a shaft center, and configured to rotate in a direction opposite the conductive member and a second electrode which is connected to the shaft center of the conductive member;

a current value measuring step of measuring a current value flowing between the first electrode and the second electrode when the evaluation voltage is applied by the voltage applying step;

an extreme value obtaining step of obtaining at least one value amongst a maximum value and a minimum value in one cycle of the AC component included in the current value from the current value measured by the current value measuring step; and an evaluation step of evaluating the conductive member based on said at least one value obtained by the extreme value obtaining step, wherein the evaluation step calculates a variation of the obtained value, per unit time in a predetermined evaluation period, obtained by the extreme value obtaining step, and evaluates the conductive member based on a result in which the variation is compared to a previously defined standard variation value.

8. The conductive member evaluation method according to claim 7, wherein the evaluation step calculates a difference value between the maximum value and the minimum value in a predetermined evaluation period, and evaluates the conductive member based on a result in which the difference value is compared to a previously defined standard difference value.

9. The conductive member evaluation method according to claim 7, wherein the evaluation step calculates a deviation of obtained value, in a predetermined evaluation period, obtained by the extreme value obtaining step, and evaluates the conductive member based on a result in which the deviation is compared to a previously defined standard deviation value.

10. The conductive member evaluation method according to claim 8, wherein the evaluation period is one rotation period of the conductive member.

11. The conductive member evaluation method according to claim 9, wherein the evaluation period is one rotation period of the conductive member.

12. The conductive member evaluation method according to claim 7, wherein the evaluation period is one rotation period of the conductive member.

* * * * *